(12) United States Patent  
Matsubayashi et al.

(10) Patent No.: US 9,062,851 B2
(45) Date of Patent: Jun. 23, 2015

(54) LED LAMP, LED ILLUMINATION DEVICE, AND LED MODULE

(75) Inventors: Yoko Matsubayashi, Osaka (JP); Hiroshi Yagi, Osaka (JP); Masanori Shimizu, Kyoto (JP); Yoshio Manabe, Osaka (JP); Atsushi Motoya, Shiga (JP); Kazuhiro Matsuo, Osaka (JP); Toshio Mori, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 245 days.

(21) Appl. No.: 13/575,430

(22) PCT Filed: Feb. 16, 2011

(86) PCT No.: PCT/JP2011/000856
§ 371 (c)(1),
(2), (4) Date: Jul. 26, 2012

(87) PCT Pub. No.: WO2011/108203
PCT Pub. Date: Sep. 9, 2011

(65) Prior Publication Data
US 2012/0300432 A1  Nov. 29, 2012

(30) Foreign Application Priority Data

Mar. 20, 2010 (JP) .................................. 2010-044516
Dec. 22, 2010 (WO) .................. PCT/JP2010/007431

(51) Int. Cl.
*F21V 9/16* (2006.01)
*F21V 3/04* (2006.01)
*F21K 99/00* (2010.01)
(Continued)

(52) U.S. Cl.
CPC ............... *F21V 3/0481* (2013.01); *F21K 9/135* (2013.01); *F21K 9/56* (2013.01); *F21Y 2101/02* (2013.01); *H01L 33/504* (2013.01); *F21K 9/17* (2013.01); *F21Y 2103/003* (2013.01); *C09K 11/7774* (2013.01); *C03C 3/00* (2013.01)

(58) Field of Classification Search
None
See application file for complete search history.

(56) References Cited

U.S. PATENT DOCUMENTS

2004/0119086 A1  6/2004  Yano et al.
2006/0022582 A1*  2/2006  Radkov ........................ 313/503
(Continued)

FOREIGN PATENT DOCUMENTS

CN  100352069  11/2007
CN  201262382  6/2009
(Continued)

OTHER PUBLICATIONS

Machine translation of JP 2010-040558, Feb. 18, 2010.*
(Continued)

*Primary Examiner* — Britt D Hanley
(74) *Attorney, Agent, or Firm* — Greenblum Bernstein, P.L.C.

(57) ABSTRACT

An LED lamp provides a strong red color with a natural appearance. The LED lamp is provided with an LED module and a filter. The LED module includes a blue LED with a main emission peak in the 440 nm to 460 nm wavelength band, a green/yellow phosphor that is excited by light emitted by the blue LED, and a red phosphor that is excited by light emitted by at least one of the blue LED and the green/yellow phosphor. The filter reduces the spectral radiation intensity of at least a portion of the 570 nm to 590 nm wavelength band among light emitted by the LED module.

24 Claims, 29 Drawing Sheets

(51) Int. Cl.
   *C09K 11/77* (2006.01)
   *C03C 3/00* (2006.01)
   *F21Y 101/02* (2006.01)
   *H01L 33/50* (2010.01)
   *F21Y 103/00* (2006.01)

(56) References Cited

U.S. PATENT DOCUMENTS

| | | | |
|---|---|---|---|
| 2007/0241657 A1 | 10/2007 | Radkov et al. | |
| 2007/0259206 A1* | 11/2007 | Oshio | 428/690 |
| 2009/0121615 A1* | 5/2009 | Le Toquin | 313/503 |
| 2010/0289044 A1* | 11/2010 | Krames et al. | 257/98 |
| 2010/0323204 A1* | 12/2010 | Tomozawa et al. | 428/426 |
| 2011/0037084 A1 | 2/2011 | Sekii et al. | |
| 2012/0104317 A1* | 5/2012 | Nagatomi et al. | 252/301.6 R |
| 2012/0119640 A1* | 5/2012 | Nishioka et al. | 313/498 |

FOREIGN PATENT DOCUMENTS

| | | |
|---|---|---|
| CN | 201373280 | 12/2009 |
| CN | 201408780 | 2/2010 |
| EP | 1930393 | 6/2008 |
| JP | 2000-11954 | 1/2000 |
| JP | 2003-331795 | 11/2003 |
| JP | 2004-193581 | 7/2004 |
| JP | 2007-116133 | 5/2007 |
| JP | 2010-40558 | 2/2010 |
| WO | 2008/087404 | 7/2008 |

OTHER PUBLICATIONS

Machine translation of JP 2007-116133, May 10, 2007.*
Machine translation of JP 2003-331795, Nov. 21, 2003.*
"Method of Specifying Colour Rendering Properties of Light Sources", Japanese Industrial Standard (JIS) Z 8726, 1990. (and English Translation).
"Classification of Fluorescent Lamps by Chromaticity and Color Rendering Property", Japanese Industrial Standard (JIS) Z 9112, 2004. (and English Translation).
Chinese Office Action dated Mar. 5, 2014 with English language translation.
International Search Report dated Apr. 5, 2011 with English language translation.
Search report from E.P.O., mail date is Jul. 17, 2014.
E.P.O. Office action, mail date is Mar. 23, 2015.

* cited by examiner

FIG. 3A

|  | No filter | 0.27mm air | 0.43mm air | 0.5mm air | 0.6mm air | 0.7mm air | 1mm air |
|---|---|---|---|---|---|---|---|
| Tc | 3571 | 3623 | 3709 | 3754 | 3776 | 3805 | 3879 |
| duv | 4.746 | 4.3 | 3.7 | 3.5 | 3.2 | 2.9 | 1.9 |
| Ra | 69 | 75 | 78 | 79 | 81 | 82 | 84 |
| Ga | 87 | 92 | 96 | 97 | 99 | 101 | 105 |
| M | 93 | 101 | 107 | 109 | 112 | 114 | 121 |
| R9 | −37 | 1 | 25 | 35 | 47 | 59 | 91 |
| R15 | 57 | 70 | 79 | 82 | 86 | 91 | 97 |
| Ga4 | 85 | 91 | 95 | 96 | 98 | 100 | 105 |
| Flux ratio [%] | 100 | 84 | 78 | 76 | 73 | 70 | 62 |

FIG. 3B

|  | No filter | 0.27mm air | 0.43mm air | 0.5mm air | 0.6mm air | 0.7mm air | 1mm air |
|---|---|---|---|---|---|---|---|
| Tc | 3508 | 3514 | 3572 | 3603 | 3605 | 3614 | 3635 |
| duv | 0.8 | −0.3 | −1.3 | −1.8 | −2.3 | −2.9 | −4.5 |
| Ra | 82 | 87 | 88 | 88 | 87 | 85 | 81 |
| Ga | 98 | 104 | 108 | 109 | 111 | 113 | 118 |
| M | 112 | 121 | 127 | 129 | 132 | 134 | 142 |
| R9 | 37 | 74 | 97 | 93 | 81 | 70 | 40 |
| R15 | 80 | 93 | 97 | 94 | 90 | 85 | 74 |
| Ga4 | 98 | 103 | 107 | 108 | 110 | 112 | 116 |
| Flux ratio [%] | 100 | 85 | 80 | 78 | 75 | 72 | 65 |

FIG. 5

| YAG | 535 | | | | 540 | | | | 550 | | | | 555 | | | | 560 | | | |
|---|---|---|---|---|---|---|---|---|---|---|---|---|---|---|---|---|---|---|---|---|
| Red | R645 | | | | R645 | | | | R645 | | | | R645 | | | | R645 | | | |
| Color classification point | A | B | C | D | A | B | C | D | A | B | C | D | A | B | C | D | A | B | C | D |
| Peak wavelength | 635 | 635 | 625 | 630 | 630 | 630 | 615 | 620 | 610 | 615 | 590 | 600 | 625 | 625 | 605 | 610 | 610 | 615 | 590 | 600 |
| Full width at half maximum | 115 | 110 | 175 | 180 | 150 | 130 | 165 | 165 | 155 | 160 | 140 | 150 | 145 | 140 | 145 | 155 | 140 | 135 | 115 | 125 |
| Tc | 2596 | 2595 | 3224 | 3149 | 2620 | 2618 | 3271 | 3172 | 2620 | 2618 | 3271 | 3172 | 2574 | 2648 | 3252 | 3149 | 2617 | 2601 | 3250 | 3151 |
| duv | 8 | -2 | 8 | -2 | 8 | -1 | 9 | -1 | 8 | -1 | 9 | -1 | 8 | -2 | 8 | -2 | 8 | -2 | 8 | -2 |
| Ra | 91 | 91 | 97 | 95 | 94 | 97 | 89 | 93 | 91 | 94 | 84 | 89 | 89 | 91 | 81 | 86 | 78 | 81 | 69 | 74 |
| Ga | 87 | 103 | 96 | 104 | 91 | 103 | 95 | 102 | 90 | 102 | 93 | 99 | 91 | 101 | 92 | 98 | 88 | 96 | 85 | 91 |
| M | 120 | 129 | 117 | 125 | 118 | 127 | 112 | 121 | 116 | 124 | 109 | 117 | 115 | 122 | 107 | 115 | 106 | 114 | 94 | 104 |
| R9 | 98 | 90 | 80 | 96 | 73 | 83 | 46 | 68 | 59 | 70 | 28 | 51 | 51 | 60 | 16 | 40 | 11 | 26 | -38 | -7 |
| R15 | 96 | 93 | 93 | 96 | 90 | 97 | 82 | 92 | 86 | 93 | 77 | 87 | 84 | 89 | 73 | 83 | 70 | 78 | 57 | 68 |
| Ga4 | 100 | 106 | 102 | 107 | 101 | 106 | 99 | 104 | 100 | 104 | 97 | 101 | 100 | 103 | 95 | 100 | 96 | 99 | 87 | 93 |

| YAG | 535 | | | | 540 | | | | 550 | | | | 555 | | | | 560 | | | |
|---|---|---|---|---|---|---|---|---|---|---|---|---|---|---|---|---|---|---|---|---|
| Red | R620 | | | | R620 | | | | R620 | | | | R620 | | | | R620 | | | |
| Color classification point | A | B | C | D | A | B | C | D | A | B | C | D | A | B | C | D | A | B | C | D |
| Peak wavelength | 615 | 615 | 600 | 605 | 610 | 610 | 590 | 595 | 605 | 605 | 585 | 595 | 605 | 605 | 580 | 590 | 595 | 595 | 575 | 580 |
| Full width at half maximum | 125 | 120 | 155 | 155 | 130 | 125 | 140 | 140 | 130 | 130 | 130 | 135 | 130 | 125 | 130 | 130 | 130 | 125 | 105 | 115 |
| Tc | 2613 | 2599 | 3247 | 3148 | 2634 | 2619 | 3269 | 3170 | 2634 | 2622 | 3272 | 3172 | 2598 | 2606 | 3253 | 3150 | 2602 | 2559 | 3252 | 3154 |
| duv | 8 | -2 | 8 | -2 | 8 | -2 | 9 | -2 | 8 | -2 | 9 | -1 | 8 | -2 | 8 | -2 | 8 | -2 | 8 | -2 |
| Ra | 86 | 87 | 84 | 87 | 78 | 80 | 75 | 78 | 75 | 77 | 71 | 74 | 72 | 74 | 68 | 72 | 65 | 66 | 59 | 63 |
| Ga | 87 | 97 | 91 | 97 | 90 | 97 | 90 | 95 | 89 | 96 | 88 | 93 | 89 | 95 | 87 | 92 | 88 | 91 | 82 | 87 |
| M | 107 | 114 | 105 | 111 | 106 | 113 | 101 | 108 | 104 | 111 | 99 | 105 | 103 | 109 | 97 | 104 | 99 | 104 | 89 | 96 |
| R9 | 24 | 32 | 18 | 32 | 4 | 13 | -10 | 6 | -4 | 5 | -21 | -4 | -11 | -1 | -30 | -11 | -27 | -21 | -61 | -39 |
| R15 | 75 | 81 | 74 | 81 | 68 | 74 | 64 | 72 | 65 | 71 | 60 | 68 | 63 | 68 | 58 | 66 | 57 | 62 | 47 | 57 |
| Ga4 | 92 | 97 | 93 | 97 | 92 | 96 | 91 | 95 | 92 | 95 | 89 | 93 | 91 | 94 | 88 | 92 | 90 | 91 | 83 | 87 |

FIG. 6

| Green | | | | | G525 | | | | G525 | |
|---|---|---|---|---|---|---|---|---|---|---|
| Red | | | | | R645 | | | | R620 | |
| Color classification point | A | B | C | D | | A | B | C | D |
| Peak wavelength | 645 | 645 | 645 | 645 | | | 620 | 615 | 615 |
| Full width at half maximum | 90 | 90 | 130 | 105 | | | 120 | 170 | 165 |
| Tc | 2601 | 2600 | 3247 | 3150 | | | 2601 | 3252 | 3147 |
| duv | 8 | -2 | 8 | -2 | | | -2 | 8 | -2 |
| Ra | 72 | 73 | 77 | 74 | | | 92 | 93 | 92 |
| Ga | 86 | 108 | 104 | 113 | | | 96 | 94 | 101 |
| M | 136 | 146 | 138 | 145 | | | 118 | 117 | 123 |
| R9 | 23 | 17 | 14 | 4 | | | 55 | 80 | 87 |
| R15 | 71 | 67 | 71 | 65 | | | 89 | 95 | 97 |
| Ga4 | 113 | 118 | 116 | 120 | | | 102 | 103 | 105 |

FIG. 8

| YAG | 535 | | | | 540 | | | | 550 | | | | 555 | | | | 560 | | | |
|---|---|---|---|---|---|---|---|---|---|---|---|---|---|---|---|---|---|---|---|---|
| Red | R645 | | | | R645 | | | | R645 | | | | R645 | | | | R645 | | | |
| Color classification point | A | B | C | D | A | B | C | D | A | B | C | D | A | B | C | D | A | B | C | D |
| Peak wavelength | 625 | 630 | 620 | 625 | 615 | 620 | 600 | 610 | 610 | 615 | 590 | 600 | 605 | 610 | 585 | 595 | 590 | 595 | 580 | 585 |
| Full width at half maximum | 180 | 180 | 175 | 185 | 165 | 170 | 155 | 165 | 155 | 160 | 140 | 150 | 150 | 150 | 130 | 140 | 115 | 120 | 105 | 105 |
| Tc | 3259 | 3246 | 3755 | 3801 | 3275 | 3269 | 3825 | 3820 | 3275 | 3269 | 3825 | 3820 | 3253 | 3251 | 3801 | 3804 | 3253 | 3251 | 3804 | 3797 |
| duv | 8 | -2 | 8 | -2 | 9 | -1 | 9 | -1 | 9 | -1 | 9 | -1 | 8 | -2 | 8 | -2 | 8 | -2 | 8 | -2 |
| Ra | 97 | 96 | 93 | 97 | 89 | 92 | 84 | 88 | 84 | 88 | 79 | 83 | 80 | 84 | 75 | 80 | 69 | 73 | 63 | 68 |
| Ga | 97 | 104 | 97 | 103 | 95 | 101 | 93 | 99 | 93 | 99 | 90 | 96 | 91 | 98 | 88 | 94 | 85 | 91 | 80 | 86 |
| M | 118 | 124 | 112 | 118 | 112 | 119 | 105 | 112 | 108 | 116 | 100 | 107 | 106 | 113 | 97 | 105 | 94 | 102 | 83 | 91 |
| R9 | 89 | 98 | 64 | 91 | 46 | 65 | 21 | 46 | 28 | 48 | -1 | 26 | 14 | 35 | -17 | 12 | -38 | -13 | -80 | -46 |
| R15 | 96 | 97 | 88 | 99 | 82 | 91 | 75 | 86 | 76 | 86 | 69 | 80 | 72 | 82 | 64 | 76 | 57 | 67 | 47 | 59 |
| Ga4 | 102 | 107 | 100 | 105 | 99 | 103 | 96 | 100 | 97 | 101 | 92 | 97 | 95 | 99 | 90 | 95 | 87 | 92 | 80 | 86 |

| YAG | 535 | | | | 540 | | | | 550 | | | | 555 | | | | 560 | | | |
|---|---|---|---|---|---|---|---|---|---|---|---|---|---|---|---|---|---|---|---|---|
| Red | R620 | | | | R620 | | | | R620 | | | | R620 | | | | R620 | | | |
| Color classification point | A | B | C | D | A | B | C | D | A | B | C | D | A | B | C | D | A | B | C | D |
| Peak wavelength | 600 | 605 | 585 | 595 | 590 | 595 | 580 | 585 | 585 | 590 | 575 | 580 | 580 | 585 | 575 | 580 | 575 | 580 | | |
| Full width at half maximum | 155 | 155 | 155 | 160 | 140 | 140 | 130 | 135 | 130 | 135 | 120 | 130 | 130 | 130 | 110 | 120 | 105 | 110 | | |
| Tc | 3247 | 3253 | 3779 | 3800 | 3272 | 3276 | 3800 | 3819 | 3272 | 3276 | 3800 | 3819 | 3254 | 3246 | 3797 | 3799 | 3254 | 3252 | | |
| duv | 8 | -2 | 8 | -2 | 9 | -1 | 9 | -1 | 9 | -1 | 9 | -1 | 8 | -2 | 8 | -2 | 8 | -2 | | |
| Ra | 84 | 86 | 81 | 84 | 75 | 78 | 72 | 75 | 71 | 74 | 68 | 71 | 68 | 71 | 65 | 69 | 59 | 62 | | |
| Ga | 91 | 97 | 91 | 96 | 90 | 95 | 88 | 92 | 88 | 93 | 85 | 90 | 87 | 91 | 84 | 89 | 82 | 86 | | |
| M | 105 | 110 | 101 | 106 | 101 | 107 | 96 | 101 | 99 | 104 | 93 | 98 | 97 | 103 | 90 | 96 | 89 | 95 | | |
| R9 | 18 | 32 | 9 | 26 | -10 | 5 | -25 | -6 | -21 | -5 | -38 | -18 | -30 | -14 | -49 | -26 | -61 | -43 | | |
| R15 | 74 | 81 | 71 | 79 | 64 | 72 | 60 | 69 | 60 | 68 | 56 | 64 | 58 | 65 | 53 | 62 | 48 | 56 | | |
| Ga4 | 93 | 97 | 92 | 96 | 91 | 94 | 89 | 92 | 89 | 93 | 86 | 90 | 88 | 91 | 84 | 89 | 83 | 86 | | |

FIG. 9

| Green | G525 | | | | G525 | | | |
|---|---|---|---|---|---|---|---|---|
| Red | R645 | | | | R620 | | | |
| Color classification point | A | B | C | D | A | B | C | D |
| Peak wavelength | 645 | 645 | 645 | 645 | 615 | 615 | 615 | 615 |
| Full width at half maximum | 130 | 120 | 155 | 145 | 170 | 160 | 175 | 170 |
| Tc | 3250 | 3253 | 3798 | 3798 | 3254 | 3250 | 3801 | 3801 |
| duv | 8 | −2 | 8 | −2 | 8 | −2 | 8 | −2 |
| Ra | 77 | 75 | 80 | 77 | 93 | 93 | 95 | 94 |
| Ga | 103 | 113 | 107 | 115 | 95 | 102 | 97 | 104 |
| M | 137 | 144 | 135 | 141 | 117 | 122 | 116 | 121 |
| R9 | 14 | 3 | 13 | −1 | 80 | 85 | 83 | 95 |
| R15 | 71 | 65 | 73 | 65 | 95 | 98 | 95 | 95 |
| Ga4 | 116 | 120 | 117 | 121 | 103 | 105 | 103 | 107 |

FIG. 11

| YAG | | 535 | | | | 540 | | | | 550 | | | | 555 | | | | 560 | | | |
|---|---|---|---|---|---|---|---|---|---|---|---|---|---|---|---|---|---|---|---|---|---|
| Red | | R645 | | | | R645 | | | | R645 | | | | R645 | | | | R645 | | | |
| Color classification point | A | B | C | D | A | B | C | D | A | B | C | D | A | B | C | D | A | B | C | D |
| Peak wavelength | 610 | 615 | 605 | 610 | 600 | 605 | 585 | 595 | 590 | 600 | 575 | 585 | 585 | 595 | 575 | 580 | | 580 | | |
| Full width at half maximum | 180 | 185 | 175 | 180 | 155 | 160 | 140 | 150 | 140 | 150 | 125 | 135 | 130 | 135 | 115 | 125 | | 105 | | |
| Tc | 3804 | 3902 | 4399 | 4373 | 3822 | 3918 | 4409 | 4411 | 3804 | 3904 | 4395 | 4394 | 3802 | 3903 | 4400 | 4399 | | 3901 | | |
| duv | 10 | -2 | 10 | -2 | 10 | -1 | 11 | -1 | 10 | -2 | 11 | -1 | 10 | -2 | 10 | -2 | | -2 | | |
| Ra | 93 | 97 | 89 | 95 | 83 | 87 | 78 | 84 | 78 | 83 | 73 | 80 | 74 | 79 | 69 | 76 | | 67 | | |
| Ga | 94 | 103 | 93 | 101 | 92 | 98 | 88 | 96 | 89 | 96 | 85 | 93 | 87 | 93 | 82 | 90 | | 85 | | |
| M | 109 | 117 | 104 | 111 | 104 | 111 | 95 | 105 | 99 | 107 | 90 | 100 | 96 | 103 | 85 | 96 | | 89 | | |
| R9 | 57 | 88 | 42 | 72 | 17 | 43 | -13 | 28 | -3 | 24 | -38 | 6 | -22 | 8 | -60 | -13 | | -52 | | |
| R15 | 86 | 99 | 81 | 94 | 74 | 85 | 66 | 81 | 68 | 79 | 59 | 75 | 63 | 74 | 53 | 69 | | 58 | | |
| Ga4 | 99 | 105 | 97 | 103 | 95 | 100 | 90 | 97 | 92 | 97 | 86 | 94 | 89 | 94 | 82 | 91 | | 85 | | |

| YAG | | 535 | | | | 540 | | | | 550 | | | | 555 | | | | 560 | | | |
|---|---|---|---|---|---|---|---|---|---|---|---|---|---|---|---|---|---|---|---|---|---|
| Red | | R620 | | | | R620 | | | | R620 | | | | R620 | | | | R620 | | | |
| Color classification point | A | B | C | D | A | B | C | D | A | B | C | D | A | B | C | D | A | B | C | D |
| Peak wavelength | 585 | 590 | 575 | 580 | 580 | 580 | 575 | 580 | 570 | 580 | 570 | 575 | 575 | 575 | 570 | 570 | | | | |
| Full width at half maximum | 155 | 160 | 150 | 160 | 130 | 135 | 115 | 125 | 120 | 125 | 105 | 115 | 110 | 115 | 100 | 105 | | | | |
| Tc | 3803 | 3901 | 4404 | 4401 | 3822 | 3918 | 4414 | 4410 | 3813 | 3898 | 4401 | 4424 | 3799 | 3896 | 4406 | 4429 | | | | |
| duv | 10 | -2 | 10 | -2 | 11 | -1 | 11 | -1 | 10 | -2 | 11 | -2 | 10 | -2 | 10 | -2 | | | | |
| Ra | 81 | 84 | 78 | 83 | 71 | 75 | 68 | 73 | 67 | 72 | 64 | 70 | 64 | 68 | 60 | 66 | | | | |
| Ga | 89 | 95 | 88 | 94 | 86 | 92 | 83 | 90 | 85 | 90 | 81 | 87 | 83 | 88 | 79 | 85 | | | | |
| M | 99 | 105 | 94 | 101 | 94 | 100 | 87 | 95 | 92 | 98 | 84 | 92 | 89 | 95 | 81 | 89 | | | | |
| R9 | 5 | 26 | -8 | 21 | -30 | -7 | -49 | -16 | -41 | -18 | -63 | -29 | -54 | -29 | -78 | -42 | | | | |
| R15 | 69 | 79 | 66 | 78 | 58 | 68 | 54 | 66 | 55 | 65 | 49 | 63 | 51 | 62 | 45 | 59 | | | | |
| Ga4 | 91 | 96 | 89 | 95 | 87 | 92 | 84 | 90 | 85 | 90 | 81 | 88 | 83 | 88 | 79 | 85 | | | | |

FIG. 12

| Green | G525 | | | | G525 | | | |
|---|---|---|---|---|---|---|---|---|
| Red | R645 | | | | R620 | | | |
| Color classification point | A | B | C | D | A | B | C | D |
| Peak wavelength | 645 | 645 | 645 | 645 | 620 | 615 | 525 | 615 |
| Full width at half maximum | 155 | 145 | 175 | 160 | 175 | 170 | 170 | 175 |
| Tc | 3806 | 3899 | 4402 | 4402 | 3803 | 3901 | 4394 | 4398 |
| duv | 10 | -2 | 10 | -2 | 10 | -2 | 10 | -2 |
| Ra | 81 | 77 | 84 | 79 | 95 | 94 | 96 | 95 |
| Ga | 106 | 115 | 107 | 115 | 98 | 104 | 99 | 105 |
| M | 134 | 141 | 130 | 137 | 117 | 120 | 114 | 118 |
| R9 | 16 | -2 | 21 | -3 | 88 | 95 | 88 | 97 |
| R15 | 75 | 65 | 78 | 67 | 96 | 95 | 96 | 94 |
| Ga4 | 116 | 122 | 117 | 122 | 104 | 107 | 104 | 108 |

| Green | G525 | | | | G525 | | | |
|---|---|---|---|---|---|---|---|---|
| Red | R645 | | | | R620 | | | |
| Color classification point | A | B | C | D | A | B | C | D |
| Peak wavelength | 645 | 645 | 525 | 645 | 525 | 615 | 525 | 525 |
| Full width at half maximum | 180 | 160 | 205 | 180 | 175 | 180 | 165 | 170 |
| Tc | 4608 | 4595 | 5510 | 5303 | 4599 | 4618 | 5509 | 5258 |
| Ra | 86 | 79 | 88 | 80 | 97 | 94 | 96 | 96 |
| Ga | 108 | 115 | 107 | 118 | 97 | 107 | 99 | 104 |
| M | 128 | 136 | 122 | 133 | 112 | 118 | 107 | 110 |
| R9 | 28 | −3 | 33 | −5 | 84 | 94 | 81 | 87 |
| R15 | 81 | 67 | 84 | 67 | 94 | 92 | 94 | 91 |
| Ga4 | 115 | 123 | 115 | 123 | 103 | 108 | 103 | 109 |

FIG. 17

| YAG | 535 | | | | 540 | | | | 550 | | | | 555 | | | | 560 | | | |
|---|---|---|---|---|---|---|---|---|---|---|---|---|---|---|---|---|---|---|---|---|
| Red | R645 | | | | R645 | | | | R645 | | | | R645 | | | | R645 | | | |
| Color classification point | A | B | C | D | A | B | C | D | A | B | C | D | A | B | C | D | A | B | C | D |
| Peak wavelength | 520 | 520 | 525 | 520 | 570 | 580 | | 575 | | 575 | | 570 | | | | | | | | |
| Full width at half maximum | 145 | 170 | 130 | 150 | 115 | 130 | | 120 | | 125 | | 115 | | | | | | | | |
| Tc | 5696 | 5695 | 7096 | 7099 | 5668 | 5670 | | 7024 | | 5673 | | 7041 | | | | | | | | |
| duv | 15 | -2 | 15 | -2 | 16 | -1 | | -1 | | -1 | | -2 | | | | | | | | |
| Ra | 80 | 91 | 75 | 88 | 67 | 79 | | 76 | | 75 | | 71 | | | | | | | | |
| Ga | 86 | 100 | 81 | 97 | 78 | 93 | | 89 | | 89 | | 85 | | | | | | | | |
| M | 86 | 102 | 75 | 93 | 74 | 92 | | 82 | | 86 | | 76 | | | | | | | | |
| R9 | -19 | 56 | -55 | 39 | -92 | -5 | | -30 | | -32 | | -60 | | | | | | | | |
| R15 | 65 | 91 | 58 | 87 | 47 | 74 | | 69 | | 67 | | 62 | | | | | | | | |
| Ga4 | 86 | 100 | 79 | 97 | 75 | 91 | | 86 | | 86 | | 80 | | | | | | | | |

| YAG | 535 | | | | 540 | | | | 550 | | | | 555 | | | | 560 | | | |
|---|---|---|---|---|---|---|---|---|---|---|---|---|---|---|---|---|---|---|---|---|
| Red | R620 | | | | R620 | | | | R620 | | | | R620 | | | | R620 | | | |
| Color classification point | A | B | C | D | A | B | C | D | A | B | C | D | A | B | C | D | A | B | C | D |
| Peak wavelength | 525 | 525 | 525 | 525 | 530 | 530 | | 530 | | 550 | | 545 | | 555 | | | | | | |
| Full width at half maximum | 150 | 170 | 135 | 160 | 125 | 145 | | 130 | | 140 | | 125 | | 130 | | | | | | |
| Tc | 5700 | 5696 | 7096 | 7103 | 5673 | 5672 | | 7029 | | 5703 | | 7102 | | 5703 | | | | | | |
| duv | 15 | -2 | 15 | -2 | 16 | -1 | | -1 | | -2 | | -2 | | -2 | | | | | | |
| Ra | 85 | 93 | 81 | 91 | 75 | 84 | | 82 | | 81 | | 79 | | 78 | | | | | | |
| Ga | 90 | 103 | 87 | 101 | 85 | 97 | | 95 | | 95 | | 93 | | 93 | | | | | | |
| M | 93 | 105 | 85 | 99 | 86 | 99 | | 92 | | 96 | | 89 | | 93 | | | | | | |
| R9 | 18 | 72 | -1 | 68 | -28 | 33 | | 24 | | 21 | | 10 | | 7 | | | | | | |
| R15 | 74 | 95 | 69 | 94 | 61 | 83 | | 81 | | 80 | | 78 | | 76 | | | | | | |
| Ga4 | 91 | 102 | 88 | 102 | 85 | 96 | | 95 | | 94 | | 92 | | 92 | | | | | | |

FIG. 18

| Green | G525 | | | | G525 | | | |
|---|---|---|---|---|---|---|---|---|
| Red | R645 | | | | R620 | | | |
| Color classification point | A | B | C | D | A | B | C | D |
| Peak wavelength | 525 | 645 | 525 | 525 | 525 | 525 | 525 | 525 |
| Full width at half maximum | 190 | 190 | 175 | 205 | 160 | 185 | 150 | 175 |
| Tc | 5702 | 5724 | 7087 | 7111 | 5714 | 5698 | 7059 | 7103 |
| Ra | 91 | 81 | 92 | 83 | 94 | 94 | 93 | 94 |
| Ga | 103 | 117 | 100 | 117 | 95 | 106 | 94 | 107 |
| M | 119 | 130 | 108 | 125 | 104 | 114 | 98 | 109 |
| R9 | 43 | -4 | 69 | -4 | 72 | 85 | 65 | 82 |
| R15 | 86 | 68 | 94 | 70 | 89 | 89 | 87 | 89 |
| Ga4 | 115 | 123 | 109 | 124 | 102 | 111 | 100 | 111 |

FIG. 20

|  | No filter | 0.27mm air | 0.43mm air | 0.50mm air | 0.27mm silicone | 0.43mm silicone | 0.50mm silicone |
|---|---|---|---|---|---|---|---|
| Vs | 100 | 100 | 100 | 100 | 100 | 100 | 100 |
| Ila | 0.126 | 0.126 | 0.126 | 0.126 | 0.126 | 0.126 | 0.126 |
| Wla | 7.52 | 7.52 | 7.52 | 7.52 | 7.52 | 7.52 | 7.52 |
| Flux | 465 | 392 | 365 | 353 | 363 | 330 | 317 |
| Flux (relative value) | 100 | 84.3 | 78.5 | 75.9 | 78.1 | 71.0 | 68.2 |
| Tc | 2832 | 2819 | 2842 | 2856 | 2969 | 3033 | 3045 |
| Duv | 0.36 | -0.8 | -1.9 | -2.4 | -2.6 | -4.3 | -4.8 |
| Ra | 73.8 | 80.6 | 84.7 | 86.2 | 85.8 | 88.9 | 88.9 |
| R9 | -7.9 | 28.4 | 51.4 | 60.6 | 61.3 | 89.3 | 97.7 |
| R15 | 66.5 | 80.3 | 89.2 | 92.7 | 92.3 | 96.3 | 93.0 |
| Ga | 93 | 99 | 103 | 105 | 104 | 108 | 110.0 |
| M | 106 | 116 | 123 | 125 | 124 | 131 | 134.0 | critical  (1) θm1 = 45.2[°]
angle     (2) θm2 = 41.5[°]
          (3) θm3 = 41.5[°]

critical  (2) θm2 = 69.03[°]
angle     (3) θm3 = 41.5[°]

FIG. 23

|  | No filter | Silicone resin + Nd$_2$O$_3$ powder | Silicone resin + glass powder | Glass plate |
|---|---|---|---|---|
| Flux | 100 | 62 | 70 | 80 |
| Ra | 82 | 81 | 88 | 87 |
| Ga | 98 | 102 | 108 | 109 |
| M | 112 | 121 | 127 | 127 |
| R9 | 37 | 94 | 96 | 93 |
| Ga4 | 98 | 106 | 106 | 108 |

5a

5b

5c

5d

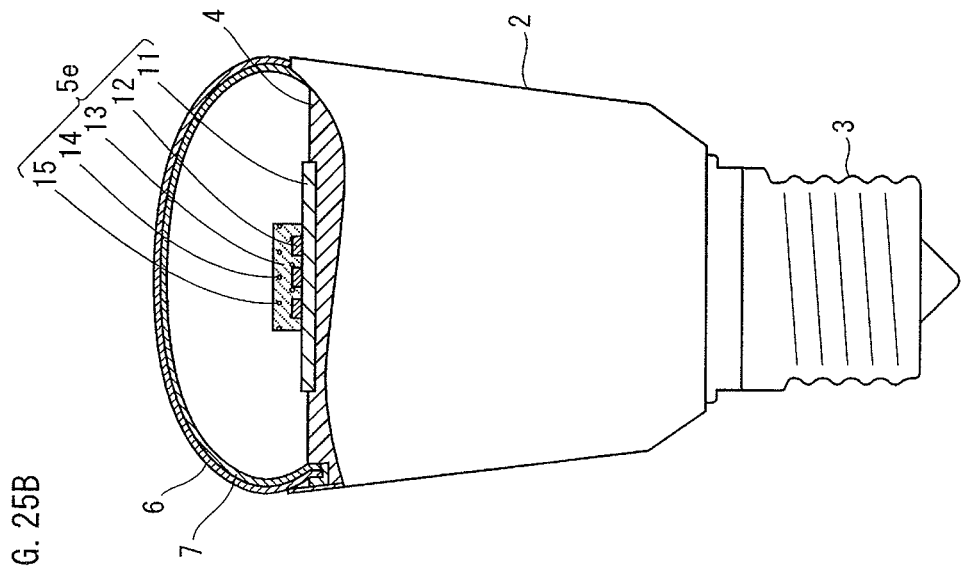
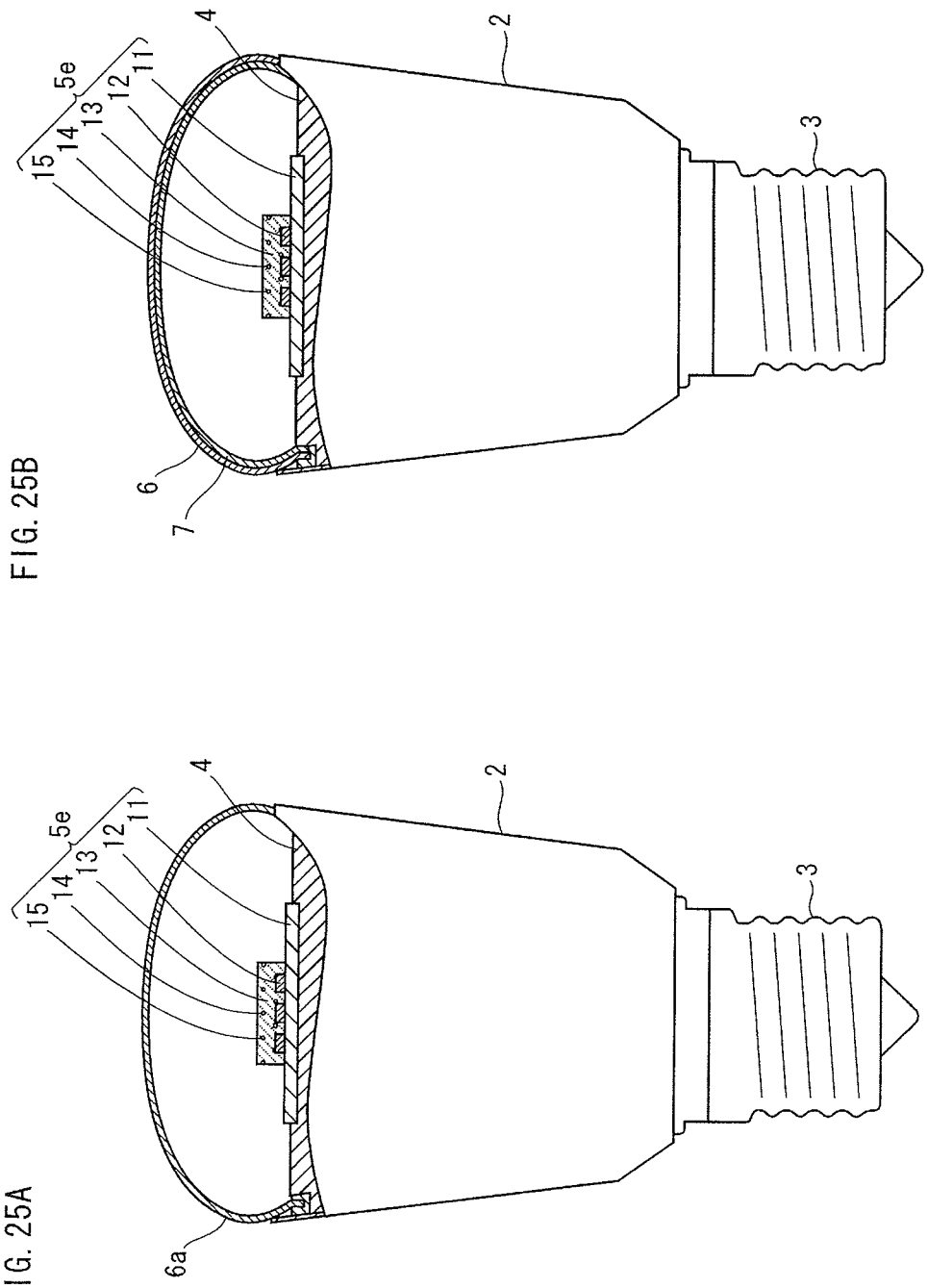

LED LAMP, LED ILLUMINATION DEVICE, AND LED MODULE

TECHNICAL FIELD

The present invention relates to an LED lamp, an LED illumination device, and an LED module, and in particular to technology for improving the color rendering thereof.

BACKGROUND ART

In recent years, LED lamps have been widely used as a highly energy-efficient replacement for incandescent light bulbs. One type of white LED light source is a combination of gallium nitride (GaN) blue LEDs and YAG yellow phosphor. Such an LED light source produces blue light from the blue LED, which excites the yellow phosphor particles, in turn producing yellow light. The combination of the blue light and the yellow light yields white light.

Typically, objects viewed under a light source should preferably appear to have natural coloring. In other words, a high color rendering index is preferable. Various conventional forms of technology have been proposed for enhancing the color rendering index of an LED light source. For example, Patent Literature 1 proposes including neodymium oxide particles in a filter element attached to the LED light source as a means of improving the general color rendering index Ra. Neodymium oxide is known as a material for filters that selectively absorbs light in a wavelength band around 580 nm (for example, see Patent Literature 2). Japanese Industrial Standard (JIS) Z8726 defines methods for evaluating the color rendering index under a light source by using color rendering indices that quantitatively assess the fidelity of color reproduction under a lamp in comparison to a reference light source.

CITATION LIST

Patent Literature

Patent Literature 1: Japanese Patent Application Publication No. 2004-193581
Patent Literature 2: Japanese Patent Application Publication No. 2000-11954

SUMMARY OF INVENTION

Technical Problem

The general color rendering index Ra assesses how natural mid-saturation test colors (R1 through R8; hereinafter referred to as "middle colors") appear. While it is of course important for a typical illumination source to show middle colors naturally, it may also be important for other colors to appear natural. For example, in places such as restaurants or stores that sell merchandise, not only mere brightness but also the appearance of illuminated objects is of great importance. In such contexts, there is a demand therefore for not only middle colors but also strong colors, in particular strong red, to appear natural.

Conventionally, technology for increasing the Ra through use of a light filter or for making illuminated objects appear natural has been disclosed in the literature. However, a way of simultaneously improving the color rendering of both middle colors and of strong red in order to achieve a natural appearance has not been available.

In recent years, the use of LED light sources in industry as an energy-efficient light source has increased dramatically. While typically available LED light sources suffice for merely guaranteeing brightness, the color rendering and the appearance of illuminated objects achieved by such LED light sources is, in some cases, insufficient. If an LED light source that simultaneously improves the color rendering of both middle colors and of strong red can be achieved, it can be expected that this energy-efficient light source will be used even more widely in stores, restaurants, and other contexts where not only brightness but also the appearance of illuminated objects is of great importance.

Therefore, it is an object of the present invention to provide an LED lamp that endows not only middle colors but also strong red with a natural appearance.

Solution to Problem

An LED lamp according to the present invention comprises: an LED light source including a blue LED with a main emission peak in a wavelength band of 440 nm to 460 nm, a green/yellow phosphor that is excited by light emitted by the blue LED, and a red phosphor that is excited by light emitted by at least one of the blue LED and the green/yellow phosphor; and a filter that reduces spectral radiation intensity of at least a portion of a wavelength band of 570 nm to 590 nm among light emitted by the LED light source.

Advantageous Effects of Invention

The LED lamp with the above structure adopts a filter that reduces the spectral radiation intensity of a specific wavelength band and includes a red phosphor in the LED light source, thereby endowing not only middle colors but also strong red with a natural appearance.

BRIEF DESCRIPTION OF DRAWINGS

FIGS. 3A and 3B list indices for assessing optical characteristics of the LED lamp, with FIG. 3A listing indices for the Comparative Example, and FIG. 3B listing indices for the Working Example.

FIG. 5 shows the simulation results for the color classification of light bulb color (L).

FIG. 6 shows the simulation results for the color classification of light bulb color (L).

FIG. 8 shows the simulation results for the color classification of warm white (WW).

FIG. 9 shows the simulation results for the color classification of warm white (WW).

FIG. 11 shows the simulation results for the color classification of white (W).

FIG. 12 shows the simulation results for the color classification of white (W).

FIG. 14 shows the simulation results for the color classification of natural light (N).

FIG. 15 shows the simulation results for the color classification of natural light (N).

FIG. 17 shows the simulation results for the color classification of daylight (D).

FIG. 18 shows the simulation results for the color classification of daylight (D).

FIG. 20 lists indices for assessing optical characteristics of the LED lamp in FIG. 19.

FIG. 23 lists indices for assessing optical characteristics of the LED lamp for each form of inclusion of neodymium.

FIGS. 25A and 25B show modifications to the placement of the filter.

DESCRIPTION OF EMBODIMENTS

Figure 1:
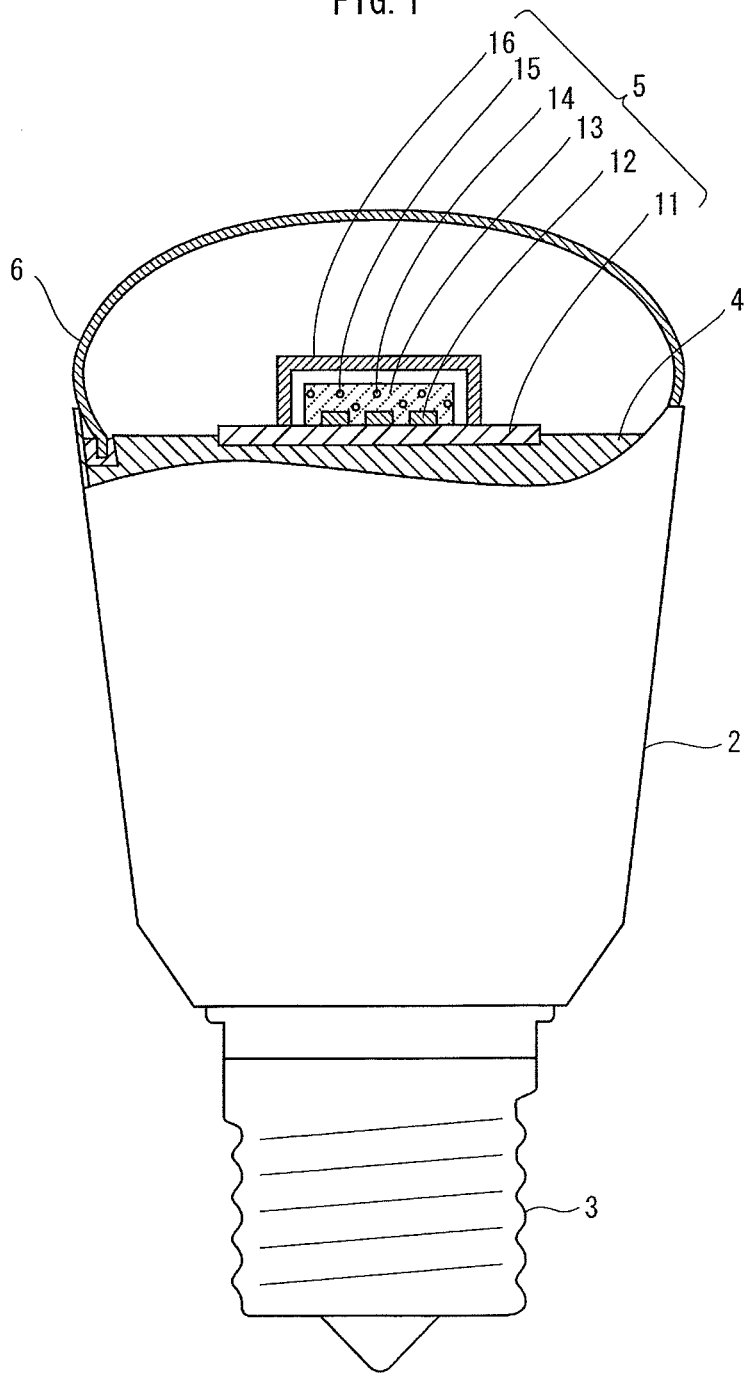
FIG. 1 illustrates the structure of an LED lamp according to an embodiment of the present invention.

The following describes an embodiment of the present invention in detail with reference to the drawings.
Structure FIG. 1 illustrates the structure of an LED lamp according to an embodiment of the present invention, with a portion of the LED lamp cut away.

An LED lamp 1 is a bulb-shaped lamp that replaces an incandescent light bulb. An E screw base 3 is attached to the proximal end of a body 2. To the distal end 4, an LED module 5 that emits white light and a globe 6 covering the LED module 5 are attached.

Within the LED module 5, blue LEDs 12 are mounted on a circuit board 11. The blue LEDs 12 are sealed by a translucent material 13 formed from silicone resin or the like. A green/yellow phosphor 14 and a red phosphor 15 are dispersed in the translucent material 13. The LED light source is formed by the combination of the blue LEDs 12, the green/yellow phosphor 14, and the red phosphor 15.

The blue LEDs 12 have a main emission peak in the 440 nm to 460 nm wavelength band. The LEDs may be, for example, gallium nitride LEDs. Note that the "main emission peak" refers to the emission peak with the largest peak value in the emission spectrum.

The green/yellow phosphor 14 is excited by light emitted by the blue LEDs 12, thereby emitting green/yellow light. Green phosphor has a main peak in the 500 nm to 540 nm wavelength band, whereas yellow phosphor has a main emission peak in the 545 nm to 595 nm wavelength band. Phosphor particles generally exhibit great variation. As a consequence, phosphor particles classified as yellow in terms of composition may be classified as green in terms of emission peak, and vice-versa. Considering how these two types of phosphor particles cannot always be distinguished, the term "green/yellow phosphor" is employed in the present description.

The red phosphor 15 is excited by either the light emitted by the blue LEDs 12 or by the green/yellow phosphor 14, or is excited by both, thereby emitting red light. The red phosphor 15 has a main emission peak in the 600 nm to 690 nm wavelength band.

A filter 16 that reduces the spectral radiation intensity of at least a portion of the 570 nm to 590 nm wavelength band of light emitted by the LED light source is disposed on the circuit board 11. This filter may, for example, be made from glass or resin including a neodymium compound (a representative example being neodymium oxide).

Generally, the full width at half maximum of an LED emission peak is narrow, whereas the full width at half maximum of a phosphor emission peak is wide. As a result, longer wavelengths of the emission peak of the green/yellow phosphor overlap with shorter wavelengths of the emission peak of the red phosphor. As a result, the spectral radiation intensity at this overlapping wavelength band is intensified, leading to an unnatural appearance for illuminated objects, which appear excessively yellow. To address this problem, a filter that reduces the spectral radiation intensity in the overlapping wavelength band is provided in the present embodiment, thereby preventing the spectral radiation intensity in the overlapping wavelength band from becoming too strong. This provides illuminated objects with a natural-looking color.

Note that in order to avoid overlap of the emission peaks, it would appear plausible to use a combination of blue LEDs, green LEDs, and red LEDs in the LED light source, instead of using a red phosphor. Using LEDs for all three primary colors, however, is simply not realistic with present technology. For example, since the luminous efficiency of currently available green LEDs is low, it would be necessary to use a large number of green LEDs in the LED light source in order to maintain the green spectral radiation intensity at a certain level. Furthermore, the spectral radiation intensity of currently available red LEDs varies according to temperature. It would thus be necessary to provide a temperature sensor and perform feedback control in order to maintain the red spectral radiation intensity at a certain level. Given these problems, using LEDs for all three primary colors would be disadvantageous in terms of both size and cost. By contrast, the present embodiment is realistic given the state of current technology and offers advantages in terms of both size and cost.

The following are examples of green phosphors. $Y_3Al_5O_{12}:Ce^{3+}$; $Tb_3Al_5O_{12}:Ce^{3+}$; $BaY_2SiAl_4O_{12}:Ce^{3+}$; $Ca_3Sc_2Si_3O_{12}:Ce^{3+}$; $(Ba, Sr)_2SiO_4:Eu^{2+}$; $CaSc_2O_4:Ce^{3+}$; $Ba_3Si_6O_{12}N_2:Eu^{2+}$; β-SiAlON: $Eu^{2+}$; $SrGa_2S_4:Eu^{2+}$.

The following are examples of yellow phosphors. $(Y,Gd)_3Al_5O_{12}:Ce^{3+}$; $Y_3Al_5O_{12}:Ce^{3+}, Pr^{3+}$; $(Tb, Gd)_3Al_5O_{12}:Ce^{3+}$; $(Sr, Ba)_2SiO_4:Eu^{2+}$; $(Sr, Ca)_2SiO_4:Eu^{2+}$; $CaSi_2O_2N_2:Eu^{2+}$; Ca-α-SiAlON: $Eu^{2+}$; $Y_2Si_4N_6C:Ce^{3+}$; $CaGa_2S_4:Eu^{2+}$.

The following are examples of red phosphors. $Ca\text{-}\alpha\text{-}SiAlON: Eu^{2+}$; $CaAlSiN_3: Eu^{2+}$; $(Sr, Ca)AlSiN_3: Eu^{2+}$; $Sr_2Si_5N_8: Eu^{2+}$; $Sr_2(Si, Al)_5(N, O)_8: Eu^{2+}$; $CaS: Eu^{2+}$; $La_2O_2S: Eu^{3+}$.

Comparison Between Working Example and Comparative Example

The following describes a specific Working Example of the present invention in comparison with a Comparative Example.

Figure 2A:
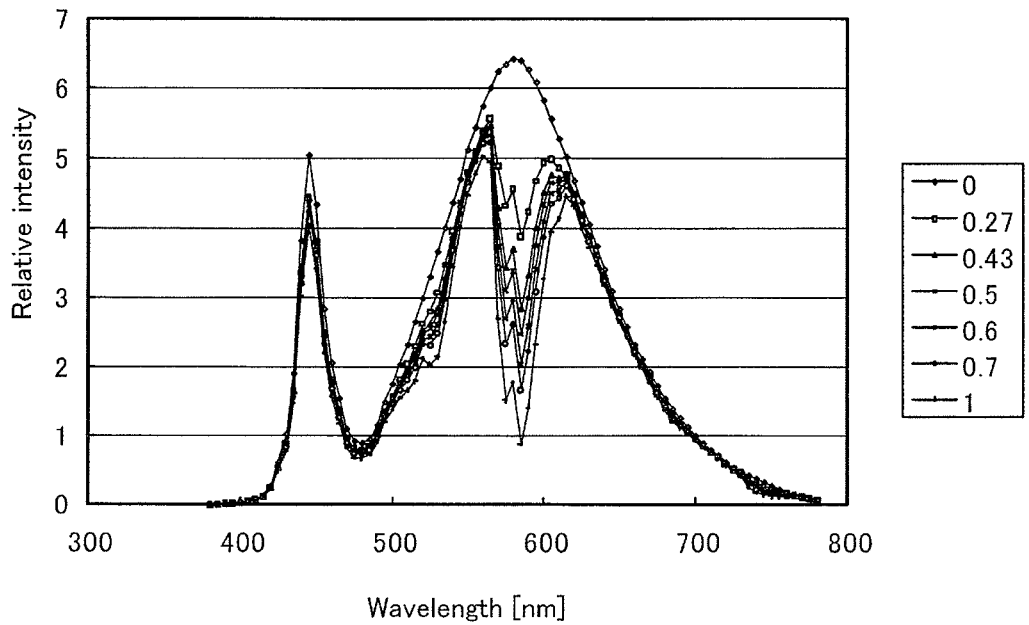
FIGS. 2A and 2B show the results of optical spectra measurements performed on an LED lamp, with FIG. 2A showing the optical spectra for a Comparative Example, and FIG. 2B showing the optical spectra for a Working Example.
Figure 2B:
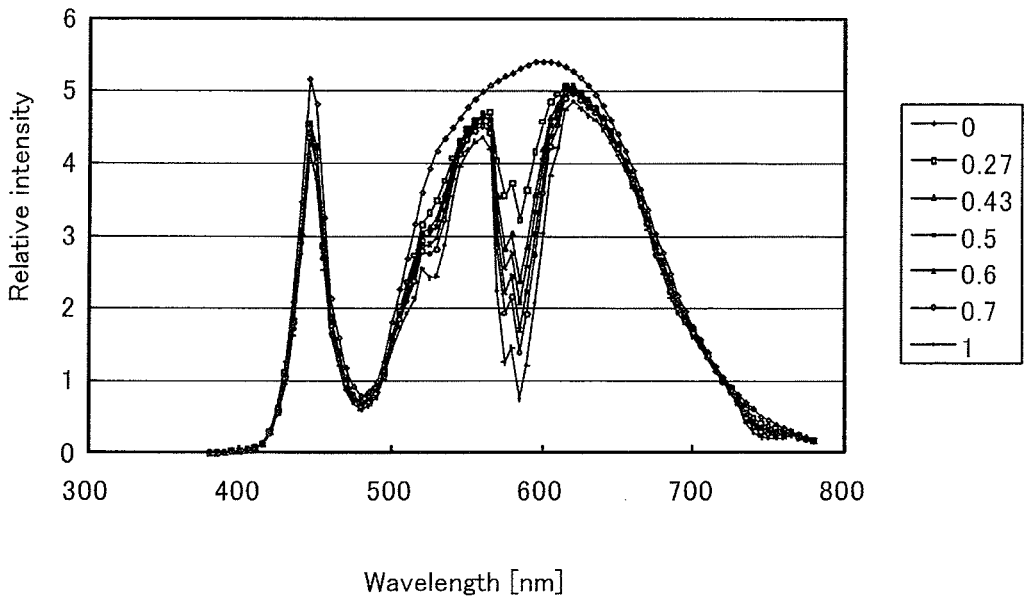

FIGS. 2A and 2B show the results of optical spectra measurements performed on an LED lamp, with FIG. 2A showing the optical spectra for the Comparative Example, and FIG. 2B showing the optical spectra for the Working Example.

As the Comparative Example, an LED light source was prepared with a combination of blue LEDs and YAG phosphor, and as the Working Example, an LED light source was prepared with a combination of blue LEDs, YAG phosphor, and red phosphor. As the filter, a thin plate of soda glass including approximately 8% neodymium oxide was prepared. The optical spectrum was measured while changing the thickness of the filter between 0 mm, 0.27 mm, 0.43 mm, 0.5 mm, 0.6 mm, 0.7 mm, and 1 mm. Note that a thickness of 0 mm for the filter means that no filter was provided. The optical spectrum for 0 mm thus corresponds to the optical spectrum of the LED light source.

As shown in FIGS. 2A and 2B, upon transmission of light from the LED light source through the filter, the spectral radiation intensity in the 570 nm to 590 nm wavelength band decreased. Furthermore, increasing the thickness of the filter amplified the decrease in spectral radiation intensity.

A comparison of FIG. 2A with FIG. 2B shows that, as compared to the Comparative Example, the emission peak of light before transmission through the filter shifted towards longer wavelengths and the full width at half maximum grew larger in the Working Example. This is because red phosphor is included in the LED light source of the Working Example yet not in the LED light source of the Comparative Example.

FIGS. 3A and 3B list indices for assessing optical characteristics of the LED lamp, with FIG. 3A listing indices for the Comparative Example, and FIG. 3B listing indices for the Working Example. The indices listed for the LED lamp are the correlated color temperature Tc, the deviation duv, the general color rendering index Ra, the color gamut surface ratio Ga, the conspicuity index M, the special color rendering indices R9 and R15, the color gamut surface ratio Ga4, and the flux ratio. First, the characteristics of each index is described before assessing the optical characteristics of the LED lamp based on the indices.

The color gamut surface ratio Ga is listed in the reference column of JIS Z8726 as an alternative method for evaluating color rendering, without using color rendering indices. Specifically, the value of the color gamut surface ratio Ga is obtained as follows. First, chromaticity coordinates are obtained for eight test colors, numbered 1 through 8, under a reference light source and under a test light source. The coordinates are plotted in the U*V* plane, and the surface area of each resulting octagon is calculated. The surface area of the octagon for the test light source is then divided by the surface area of the octagon for the reference light source, and the resulting surface area ratio is multiplied by 100.

A color gamut surface ratio Ga of under 100 is indicative of decreased saturation, and thus of a tendency toward dull colors. In contrast, a color gamut surface ratio Ga of over 100 is indicative of increased saturation, and thus of a tendency toward vivid colors. Typically, as the color saturation of an object increases, the appearance of the object improves. The color gamut surface ratio Ga is therefore a suitable index for assessing whether a color is eye-pleasing.

The conspicuity index M is an index indicating the perceived conspicuity of a color. The degree of conspicuity of a color subject that is illuminated by the test light source is expressed by the color gamut surface area of a four-color test subject. The color system used is the brightness (B) and colorfulness (Mr-g and My-b) of a non-linear color-appearance model proposed by Nayatani et al. (for example, in Color Research and Application, 20(3), 1995). The conspicuity index M is calculated as follows, using the color gamut surface area of the four-color test subject.

$$M = [G(S, 1000\ 1x)/G(D65, 1000\ 1x)]^{1.6} \times 100$$

where $G(S, 1000\ 1x)$ represents the color gamut surface area of the four-color test subject when illuminated by the test light source at 1000 1x, and $G(D65, 1000\ 1x)$ represents the color gamut surface area of the four-color test subject illuminated by the reference light source D65 at 1000 1x. As the conspicuity index M increases, colors of subjects, such as the green of flowers or foliage, appear more conspicuous.

The special color rendering index R9 is calculated based on test color No. 9 (strong red) defined by JIS Z8726. Similarly, the special color rendering index R15 is calculated based on test color No. 15 (Japanese skin color) defined by JIS Z8726.

The color gamut surface ratio Ga4 is calculated using R9 through R12, which are special color rendering indices calculated based on high-saturation test colors 9 through 12. Specifically, the color gamut surface ratio Ga4 is obtained by the same method as for calculating Ga for test colors R1 through R8, using test colors R9 through R12 instead. R1 through R8 are selected from among mid-saturation test colors in order to assess slight differences in the color appearance of natural objects. On the other hand, R9 through R12 are selected from among high-saturation test colors in order to assess the appearance of strongly colored objects. Therefore, Ga4 allows for accurate assessment of whether an object intended to appear vivid does in fact appear so.

The flux ratio is a ratio of the flux after addition of the filter to the flux before addition of the filter. The flux ratio thus indicates the decrease in spectral radiation intensity due to the filter.

As shown in FIGS. 3A and 3B, the correlated color temperature of the Comparative Example and the Working Example is near 3500 K, which corresponds to the light color classification of "warm white" as specified by JIS Z9112. The inclusion of "air" in the filter thickness entries indicates that measurements were performed with a gap between the LED light source and the filter.

In the Comparative Example, Ra, Ga, M, R9, R15, and Ga4 increased as the thickness of the glass plate including neodymium oxide, which served as the filter, increased. For example, R9, which assesses the appearance of strong red, was −37 without a filter, 59 at a thickness of 0.7, and 91 at a thickness of 1 mm. On the other hand, as the thickness of the filter increased, the flux ratio decreased. This is because as the thickness of the filter increases, the light transmitted through the filter decreased.

Currently, as no standards for the color rendering of a LED lamp exist, the desirable range of R9 for an LED lamp has not been established. Therefore, in the present description, the desirable range of R9 for an LED lamp is assumed to be 64 or greater in view of JIS Z9112, which specifies the color rendering of a broadband fluorescent lamp. This is based on how the minimum value for high color rendering (color rendering AA) R9 in JIS Z9112 is 64. Strictly speaking, the minimum value of R9 is specified for each light color classification. In this case, the smallest value among the minimum values was selected.

Furthermore, the desirable range of the flux ratio in the present description is "70% or greater". This is based on how the flux ratio of a high color rendering fluorescent lamp (color rendering AA) to an existing, typical fluorescent lamp is approximately 70%.

Based on these values, the present description applies the condition "R9 of 64 or greater and flux ratio of 70%" as the assessment standard for an LED lamp.

JIS Z9112 also specifies the minimum value of R9 for the most superior type of high color rendering (color rendering AAA). In this case as well, the minimum value is specified for each light color classification, with the largest value being 88. Therefore, if the value of R9 for the LED light source is 88 or greater, the LED light source already achieves color rendering AAA and thus does not require a separate filter. Accordingly, the present description focuses on LED lamps using an LED light source with an R9 value of less than 88.

As shown in FIG. 3A, the Comparative Example does not satisfy the above assessment standard. When the flux ratio is 70% or greater, the value of R9 is greatest when the thickness of the filter is 0.7 mm. Even so, however, the value of R9 does not reach a value of 64 or greater. This demonstrates that, for an LED light source including blue LEDs and YAG phosphor, it is difficult to show a strong red color naturally while maintaining a certain degree of efficiency when the correlated color temperature is approximately 3500 K, i.e. for the light color classification of warm white, even if a filter is attached to the LED light source.

In the Working Example, Ga, M, and Ga4 increased as the thickness of the filter increased, whereas the flux ratio decreased. This is the same tendency as in the Comparative Example. On the other hand, the value of Ra was maintained at 80 or greater regardless of the thickness of the filter. Furthermore, R9 and R15 increased as the filter grew thicker, reaching maximum values at a filter thickness of 0.43 mm and decreasing for greater thicknesses. One possible reason explaining this behavior of R9 and R15 is as follows. As the filter grows thicker, the chromaticity coordinates of the test light source approach the chromaticity coordinates of the reference light source in the U*V* plane, thus reducing color distortion. When the filter grows even thicker, however, the chromaticity coordinates of the test light source surpass and move away from the chromaticity coordinates of the reference light source, thus causing color distortion to increase. Since Ga4 simply increases, this interpretation seems natural. Note that when R9 decreases after reaching a maximum value, strong colors appear even stronger. In such cases, then, a relatively favorable appearance is still often achieved. Excessive strength, however, does appear unnatural and tends to be considered problematic during actual use. Therefore, taking color distorted to be too strong into consideration as well, the desirable range is set as "R9 of 64 or greater".

As shown in FIG. 3B, in the Working Example, many cases satisfied the assessment standard of "R9 of 64 or greater and flux ratio of 70% or greater". Adding a filter to an LED light source that includes blue LEDs, YAG phosphor, and red phosphor therefore achieves a natural appearance for strong red while maintaining a certain degree of efficiency.

On the other hand, with the same filter thickness, flux decreases by approximately 5% in the Working Example, which included blue LEDs, YAG phosphor, and red phosphor, as compared to the Comparative Example, which included blue LEDs and YAG phosphor. In other words, when taking the flux for "no filter" in the Comparative Example as a standard, the values listed for the flux ratio of the Working Example in FIG. 3B each decrease by approximately 5%. Even taking this decrease into consideration, however, the flux ratio in the Working Example is still 70% or greater for a filter thickness of 0.6 mm. The Working Example thus achieved a flux ratio of 70% or greater with respect to "no filter" in the Comparative Example and also obtained a value of 64 or greater for R9.

With this structure, both an LED lamp that prioritizes efficiency and an LED lamp that prioritizes color rendering can be created to have the same phosphor composition, being distinguished instead by the presence or absence of a filter. Since the price of phosphor varies depending on the amount ordered, the above structure leads to a lower cost for phosphor, thus allowing for the manufacture of inexpensive LED lamps.

Simulations

The inventors performed simulations in order to test which spectrum would yield light chromaticity coordinates within the light color classification specified by JIS Z9112 before transmission through the filter and would satisfy the assessment standard of "R9 value of 64 or greater and flux ratio of 70%" for light after transmission through the filter. Note that the simulations were performed for each color classification specified by JIS Z9112. Furthermore, the simulations were performed with a lower limit of −2 for the duv value of the color classification, since duv lowers upon application of a filter.

Light Bulb Color

Figure 4:
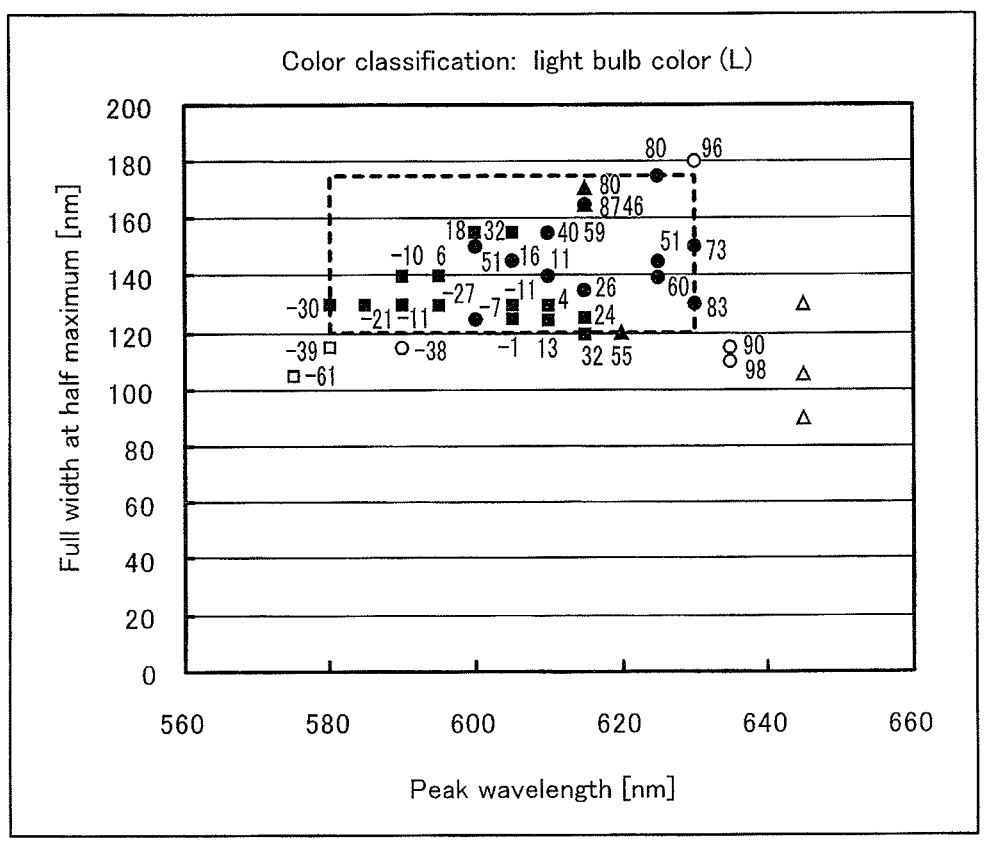
FIG. 4 is a graph plotting simulation results for the color classification of light bulb color (L).

FIG. 4 is a graph plotting simulation results for the color classification of light bulb color (L). FIGS. 5 and 6 show the simulation results for the color classification of light bulb color (L). In FIGS. 5 and 6, the "color classification point" represents the limit chromaticity coordinates for each color specified by JIS Z9112. A color classification point that could not be achieved is left blank.

As shown in FIGS. 5 and 6, the green/yellow phosphors prepared for the simulations were YAG phosphors having respective main peaks at 535 nm, 540 nm, 550 nm, 555 nm, and 560 nm, and silicate phosphors (listed as "green") having a main emission peak at 525 nm. The red phosphors (listed as "red") that were prepared had respective main emission peaks at 645 nm and 620 nm. The blue LEDs were assumed to have a main emission peak between 440 nm and 460 nm.

First, the intensities of the blue light, green/yellow light, and red light were adjusted to achieve light bulb color light, and the light spectrum at that point was calculated. The maximum peak wavelength and the full width at half maximum were then calculated as indices characterizing the light spectrum, and the indices Ra, Ga, M, R9, R15, and Ga4 for the light spectrum were also calculated.

FIG. 4 is a plot of the test light sources in FIGS. 5 and 6. The value of R9 before transmission through the filter is indicated by each point. As FIG. 4 shows, the value of R9 generally tended to increase as the peak wavelength and the full width at half maximum increased. Circles in FIG. 4 indicate a test light source in which the green/yellow phosphor was YAG with a peak wavelength between 535 nm and 560 nm, and in which the peak wavelength of the red phosphor was 645 nm. Squares indicate a test light source in which the green/yellow phosphor was YAG with a peak wavelength between 535 nm and 560 nm, and in which the peak wavelength of the red phosphor was 620 nm Triangles indicate a test light source in which the green/yellow phosphor was silicate with a peak wavelength of 525 nm, and in which the peak wavelength of the red phosphor was between 645 nm and 620 nm. Furthermore, shapes with white centers indicate either data for which the R9 value did not reach 64 or greater when the flux ratio was maintained at 70% or greater despite addition of a filter, or data for which addition of a filter was not necessary. Data for which addition of a filter was not necessary refers to when the R9 value was high to begin with, reaching 88 or greater (color rendering AAA), or to when the value of R9 was less than 88, yet the reason for the decrease could be assumed to be due to the chromaticity coordinates for the test light sources having exceeded the chromaticity coordinates of the reference light source. Filled-in shapes indicate data for which the R9 value was 88 without a filter, yet which satisfied the assessment standard of "R9 of 64 or greater and flux ratio of 70% or greater" when a filter was added.

Based on these data, for the color classification of light bulb color (L), it is possible to provide an LED lamp that achieves a natural appearance for strong red while maintaining a certain degree of efficiency by adding a filter when the maximum peak wavelength in the light spectrum before transmission through the filter is in a range of 580 nm to 630 nm and the full width at half maximum for the maximum peak wavelength is in a range of 120 nm to 175 nm (i.e. within the dashed rectangle in FIG. 4). Note that the "maximum peak wavelength" refers to the maximum among peak wavelengths of light emitted by phosphors.

The same simulation as for the light bulb color was performed for the colors warm white, white, natural light, and daylight as well, and assessment was made with the same assessment standard. The following lists the simulation results.

Warm White

Figure 7:
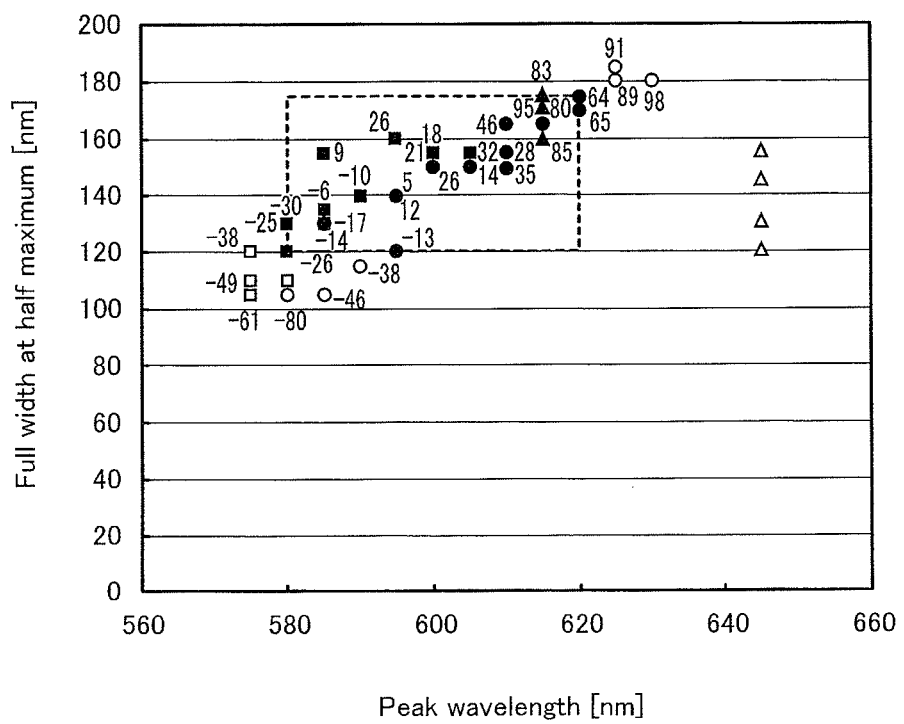
FIG. 7 is a graph plotting simulation results for the color classification of warm white (WW).

FIG. 7 is a graph plotting simulation results for the color classification of warm white (WW). FIGS. 8 and 9 show the simulation results for the color classification of warm white (WW).

For the color classification of warm white (WW), it is possible to provide an LED lamp that achieves a natural appearance for strong red while maintaining a certain degree of efficiency by providing a filter when the maximum peak wavelength in the light spectrum before transmission through the filter is in a range of 580 nm to 620 nm and the full width at half maximum for the maximum peak wavelength is in a range of 120 nm to 175 nm (i.e. within the dashed rectangle in FIG. 7).

White

Figure 10:
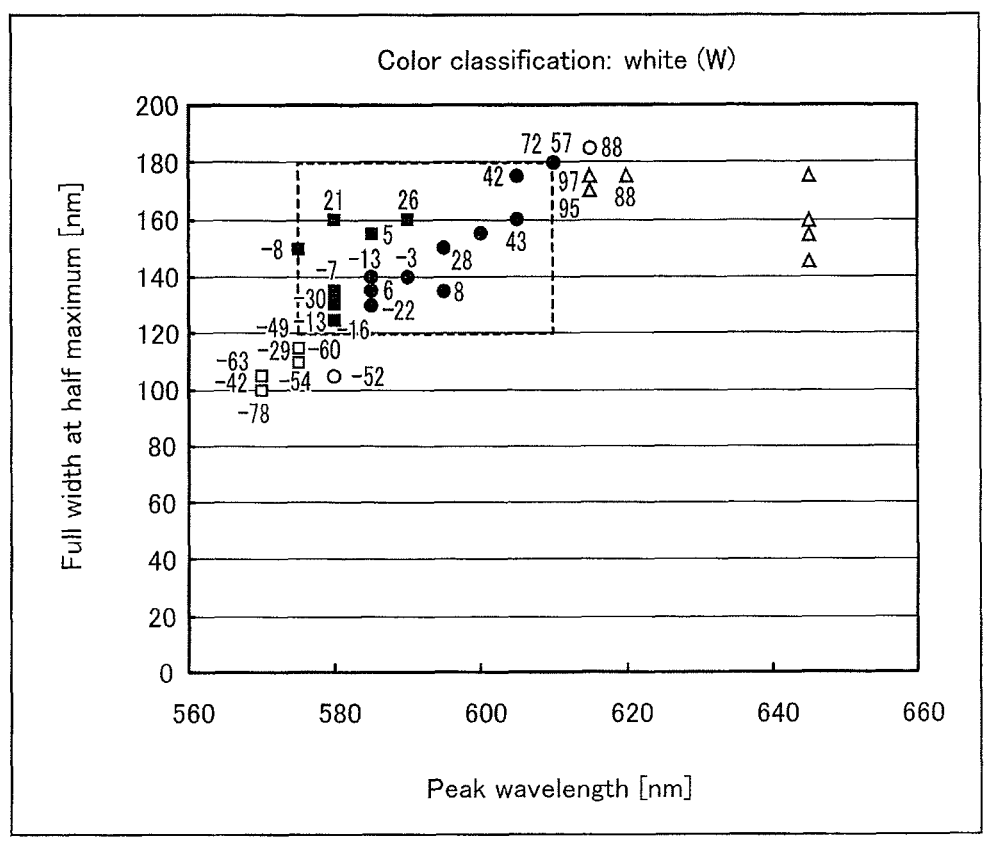
FIG. 10 is a graph plotting simulation results for the color classification of white (W).

FIG. 10 is a graph plotting simulation results for the color classification of white (W). FIGS. 11 and 12 show the simulation results for the color classification of white (W).

For the color classification of white (W), it is possible to provide an LED lamp that achieves a natural appearance for strong red while maintaining a certain degree of efficiency by providing a filter when the maximum peak wavelength in the light spectrum before transmission through the filter is in a range of 575 nm to 610 nm and the full width at half maximum for the maximum peak wavelength is in a range of 120 nm to 180 nm (i.e. within the dashed rectangle in FIG. 10).

Natural Light

Figure 13:
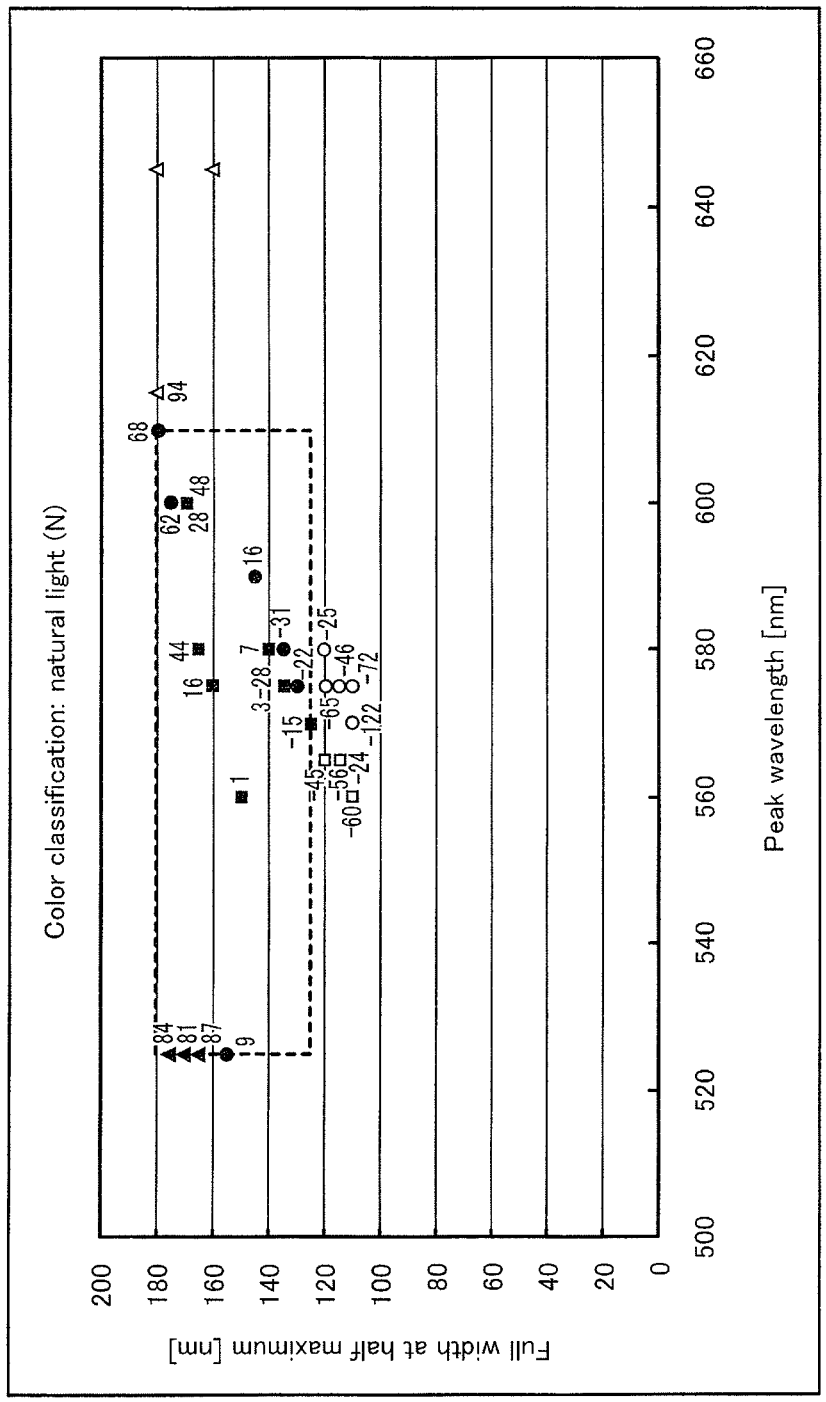
FIG. 13 is a graph plotting simulation results for the color classification of natural light (N).
Figure 14:
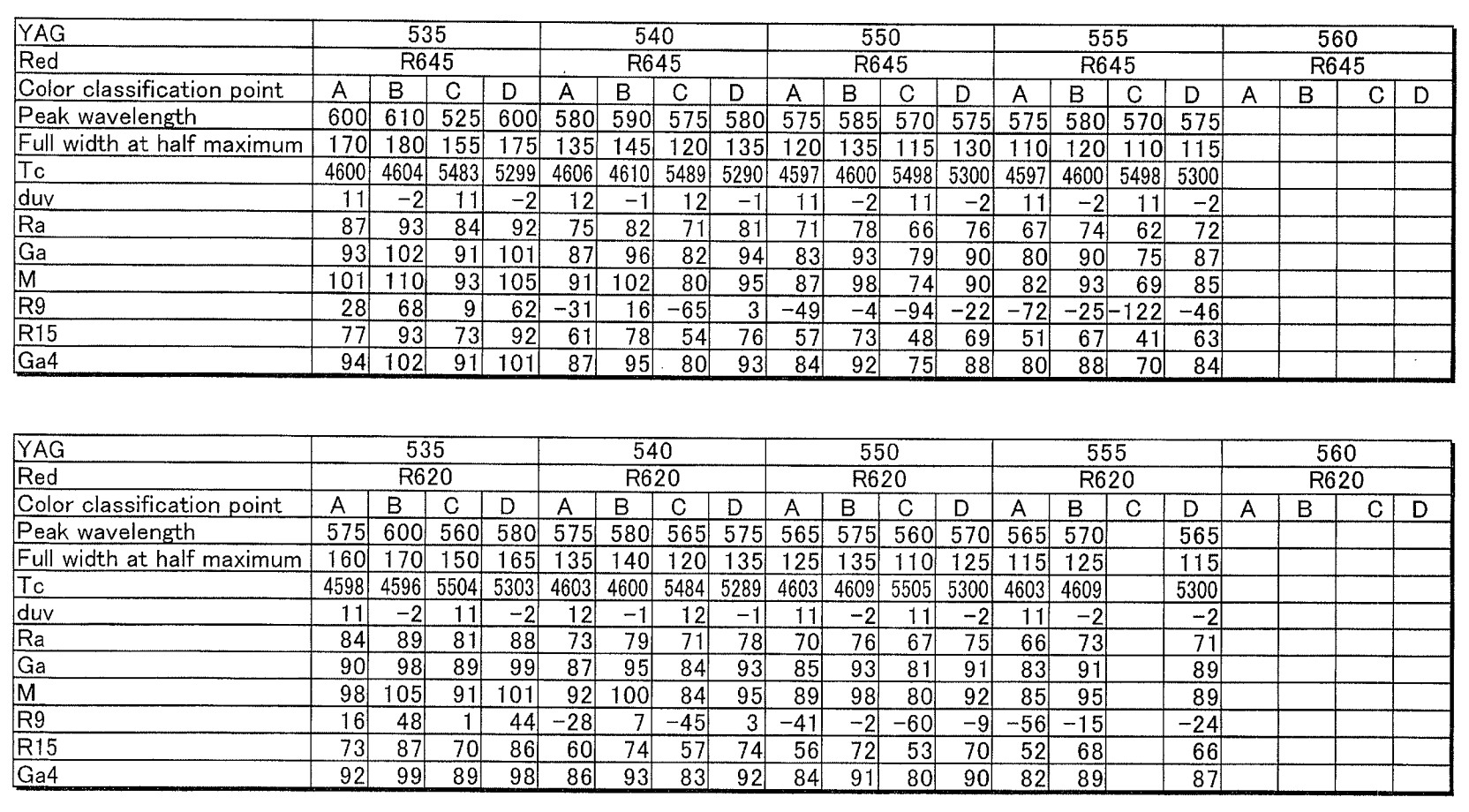

FIG. 13 is a graph plotting simulation results for the color classification of natural light (N). FIGS. 14 and 15 show the simulation results for the color classification of natural light (N).

For the color classification of natural light (N), it is possible to provide an LED lamp that achieves a natural appearance for strong red while maintaining a certain degree of efficiency by providing a filter when the maximum peak wavelength in the light spectrum before transmission through the filter is in a range of 525 nm to 610 nm and the full width at half maximum for the maximum peak wavelength is in a range of 125 nm to 180 nm (i.e. within the dashed rectangle in FIG. 13).

Daylight

Figure 16:
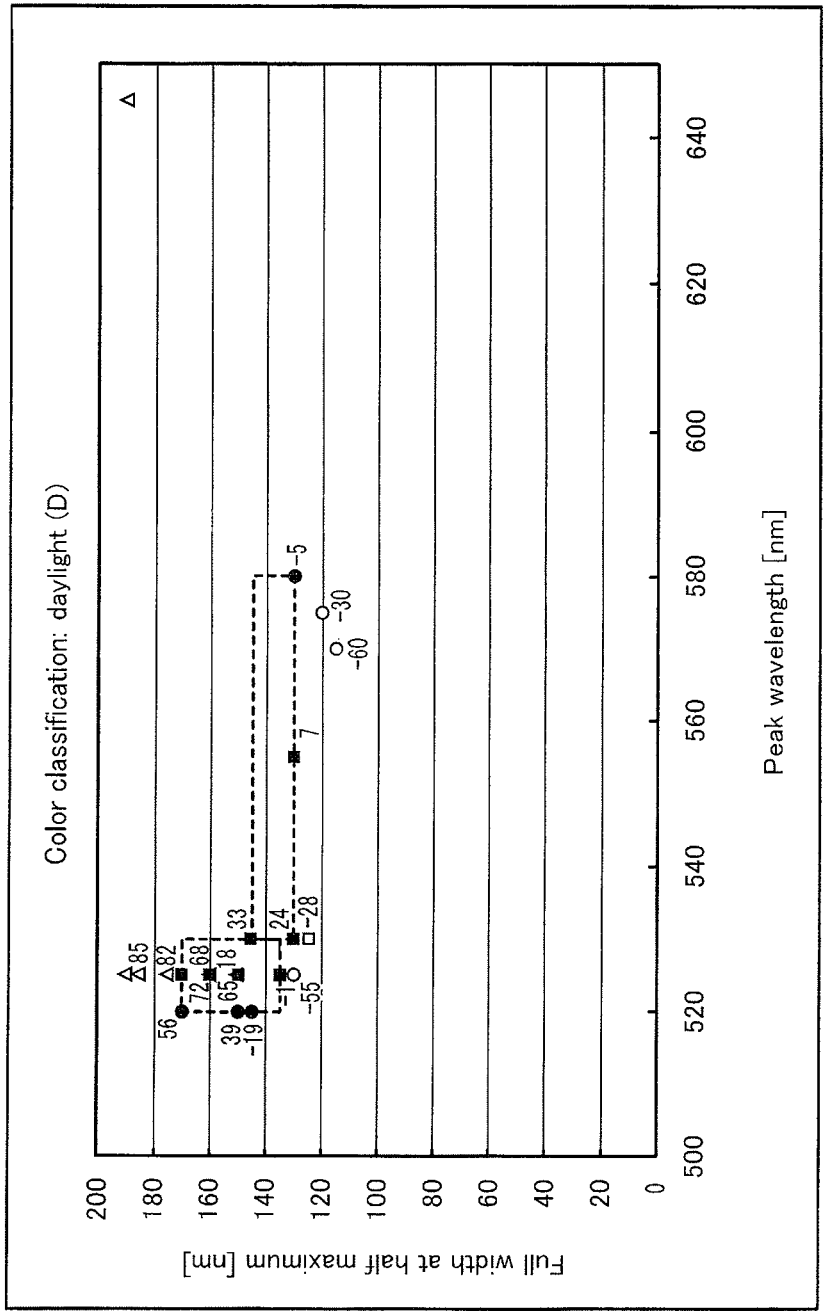
FIG. 16 is a graph plotting simulation results for the color classification of daylight (D).

FIG. 16 is a graph plotting simulation results for the color classification of daylight (D). FIGS. 17 and 18 show the simulation results for the color classification of daylight (D).

For the color classification of daylight (D), it is possible to provide an LED lamp that achieves a natural appearance for strong red while maintaining a certain degree of efficiency by providing a filter when the maximum peak wavelength in the light spectrum before transmission through the filter is in a range of 520 nm to 530 nm and the full width at half maximum for the maximum peak wavelength is in a range of 135 nm to 170 nm, or when the peak wavelength is in a range of 530 nm to 580 nm and the full width at half maximum for the maximum peak wavelength is in a range of 130 nm to 145 nm (i.e. within the dashed rectangles in FIG. 16).

Differences in Filter Effect

Next, the differences in the effects of using a filter based on differences in LED module structure are described.

Figure 19:
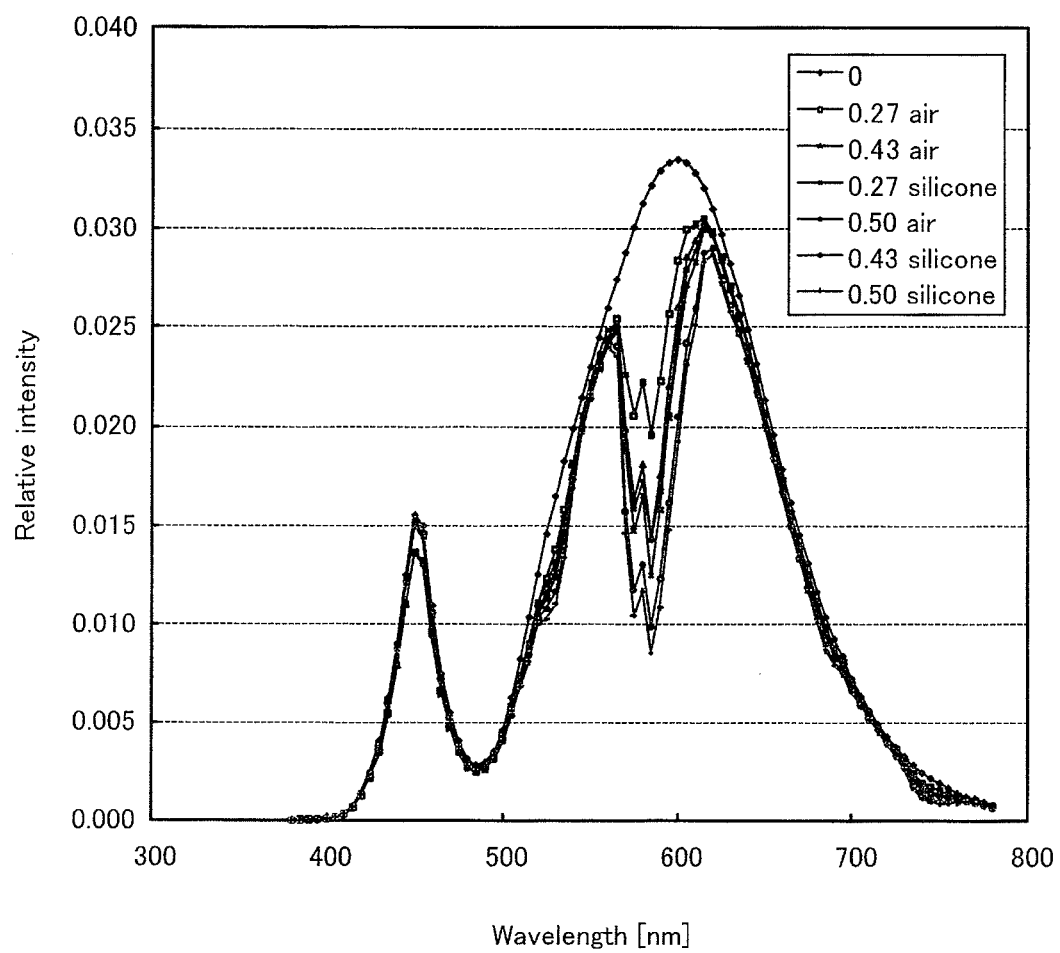
FIG. 19 shows the results of optical spectra measurements performed on an LED lamp.

FIG. 19 shows the results of optical spectra measurements performed on an LED lamp. FIG. 20 lists indices for assessing optical characteristics of the LED lamp in FIG. 19. As shown in FIG. 20, the correlated color temperature is near 2800 K, which corresponds to the light color classification of "light bulb color".

Here, the presence of a gap between the LED light source and the filter (listed as "air") is compared with a silicone packing between the LED light source and the filter (listed as "silicone"). As shown in FIG. 20, when the thickness of the filter is the same, the flux ratio decreased in the case of the silicone layer as compared to the air layer, whereas the indices Ra, R9, R15, Ga, and M all increased. Inclusion of the silicone layer is thus preferable.

Figure 21A:
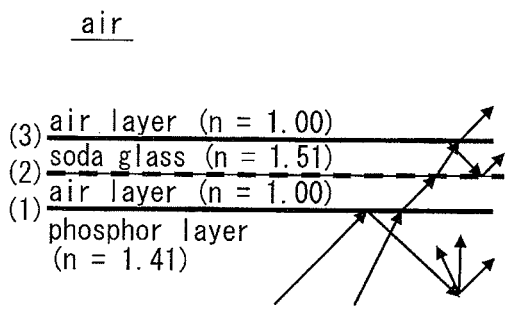
FIGS. 21A to 21C show differences in optical characteristics due to differences in LED module structure, with FIG. 21A showing the boundary surface for each layer when an air layer is present, FIG. 21B showing the boundary surface for each layer when a silicone layer is present, and FIG. 21C showing filter transmittance in the case of the air layer and of the silicone layer.
Figure 21B:
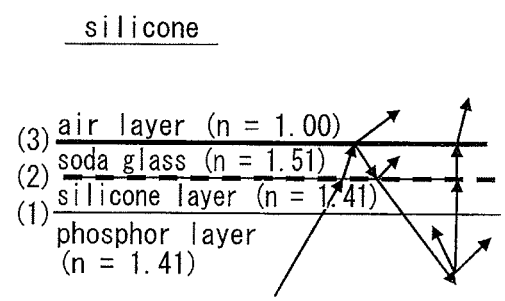
Figure 21C:
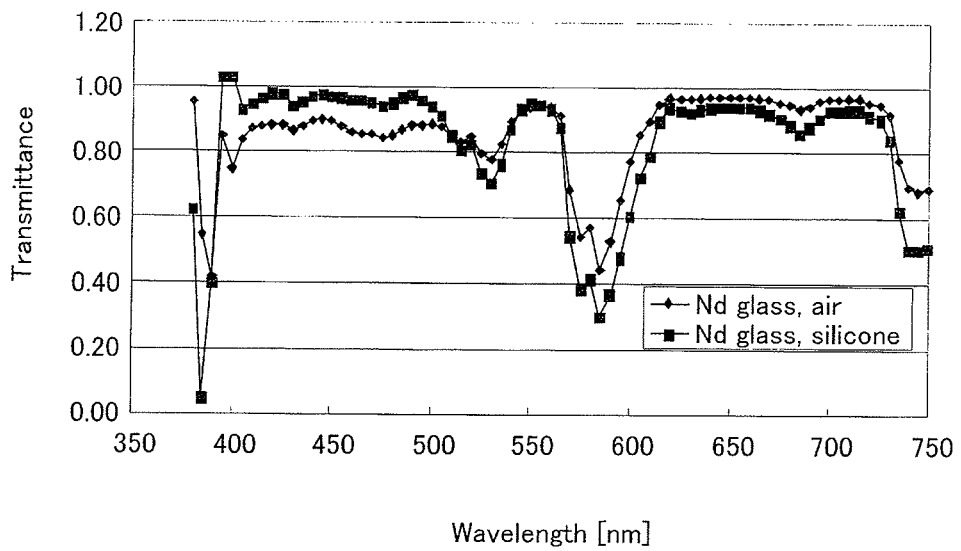

The reason for this tendency can be explained as follows. FIGS. 21A to 21C show differences in optical characteristics due to differences in LED module structure. FIG. 21A shows the boundary surface and critical angle for each layer when the air layer is present. FIG. 21B shows the boundary surface and critical angle for each layer when the silicone layer is present. FIG. 21C shows the transmittance of the filter in the case of the air layer and the case of the silicone layer.

The critical angle is defined by the refractive indices of the media along the boundary surface and refers to the smallest angle of incidence for which all light is reflected when light enters the medium with the smaller refractive index from the medium with the larger refractive index. The transmittance of the filter is calculated based not on the parallel light used at the time of material measurement, but rather based on actual measured values before and after addition of the filter.

When the silicone layer is present, the value of $\theta m2$ increases as compared to the case of the air layer, and the amount of light fully reflected at the boundary surface (2) with the phosphor layer decreases. Therefore, a larger amount of light first enters the soda glass. After propagating within the glass, a portion of the light traces the following path: the light returns to the phosphor layer and is diffused, the angle of incidence changes, and the light again traverses the filter to reach the boundary surface (3). As a result, the number of propagations within the glass increases, thus enhancing the filter effect. As shown in FIG. 21C, the spectral radiation intensity of the filter decreased in the case of the silicone layer as compared to the air layer. Note that the same advantageous effect is achieved as long as the refractive index of the translucent material between the phosphor layer and the filter is similar to or higher than the refractive index of the phosphor layer, and lower than the refractive index of the filter.

Next, differences in the filter effect due to differences in the form of inclusion of neodymium are described.

To illustrate these differences, glass that includes neodymium oxide (hereinafter referred to as a "glass plate"), silicone resin having dispersed therein powder of glass that includes neodymium oxide (hereinafter referred to as "glass powder"), and silicone resin having dispersed therein neodymium oxide powder (hereinafter referred to as "Nd powder") were prepared.

Figure 22A:
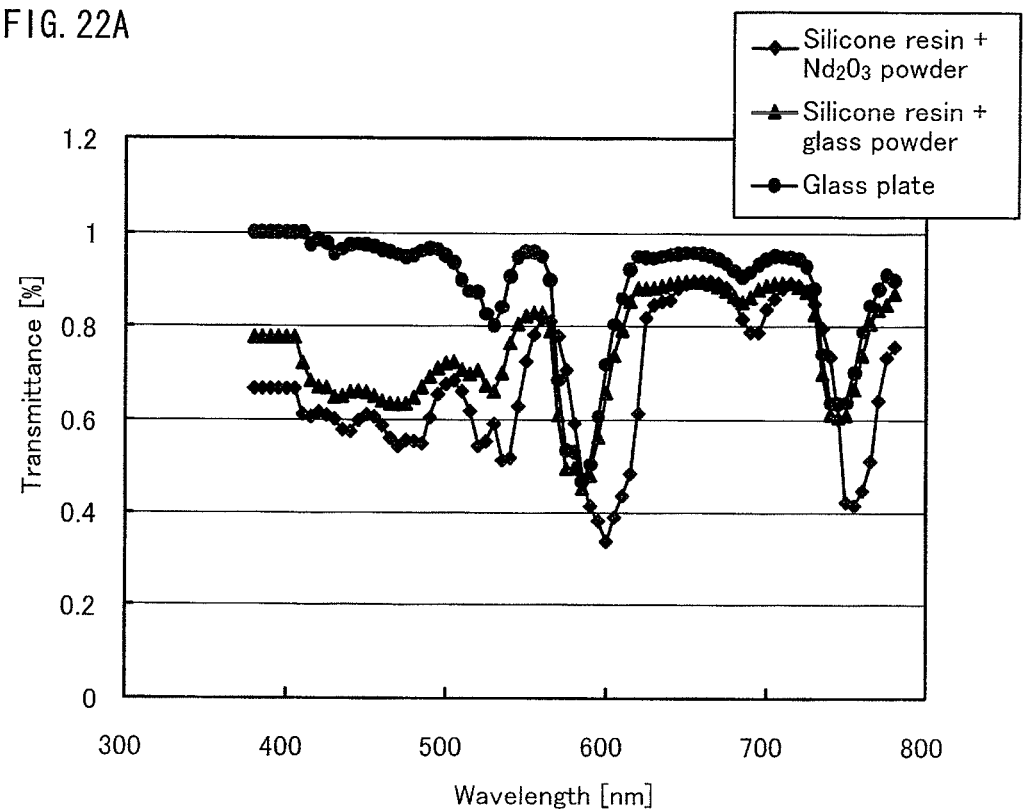
FIGS. 22A and 22B show the results of transmission spectra measurements for each form of inclusion of neodymium as well as the results of optical spectra measurements performed on an LED lamp.
Figure 22B:
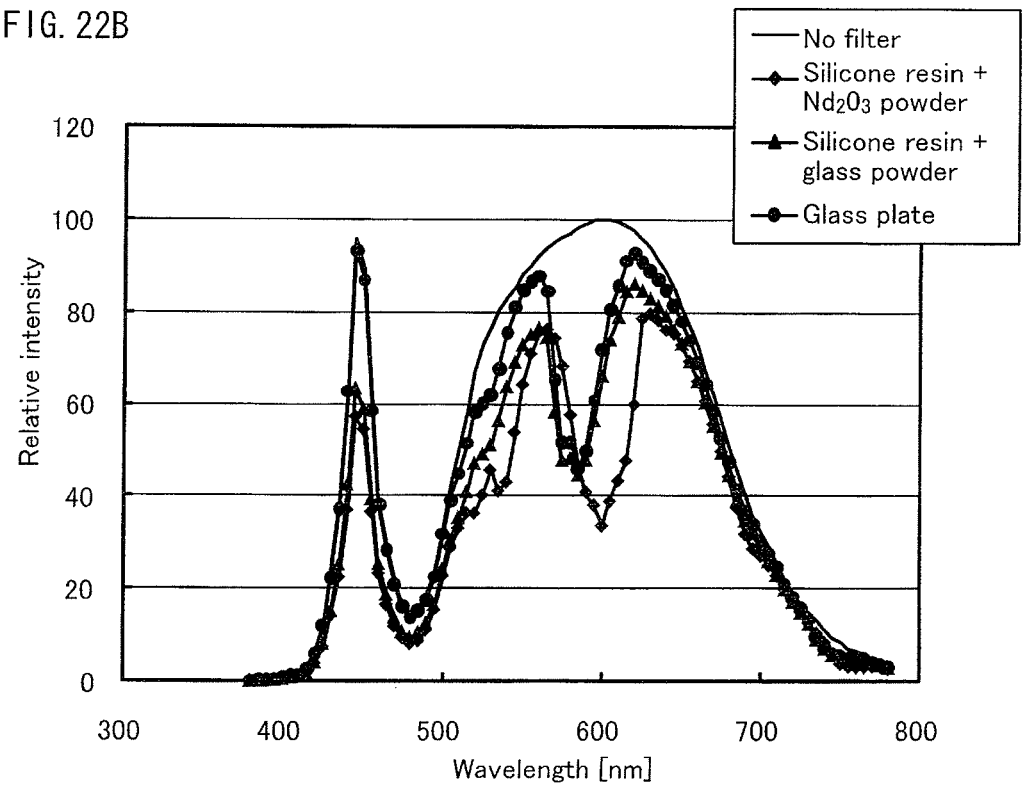
Figure 24A:
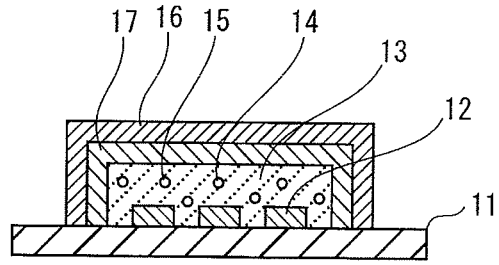
FIGS. 24A through 24D show modifications to the structure of the LED module.
Figure 24B:
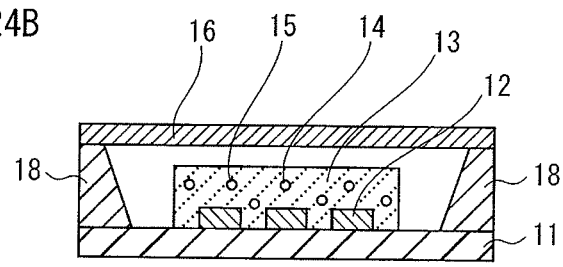
Figure 24C:
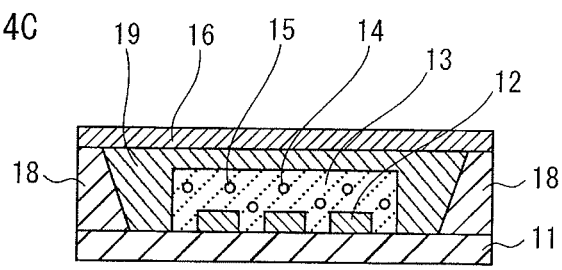
Figure 24D:
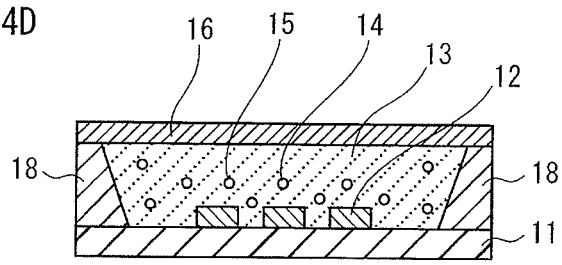

FIGS. 22A and 22B show the results of transmission spectra measurements for each form of inclusion of neodymium as well as the results of optical spectra measurements performed on an LED lamp. FIG. 23 lists indices for assessing optical characteristics of the LED lamp for each form of inclusion of neodymium.

As shown in FIGS. 22A and 22B, the transmittance of the glass plate is higher than the glass powder and the Nd powder in wavelength bands other than the 570 nm to 590 nm wavelength band. In comparison with the glass powder and the Nd powder, it is therefore possible to suppress the reduction in flux ratio of the glass plate (see FIG. 23). On the other hand, it is easier to process glass powder and Nd powder as compared to a glass plate. Therefore, the use of glass powder and Nd power is advantageous when processing the filter to have a complex shape.

Note that when manufacturing glass that includes neodymium, the ratios by weight of silica ($SiO_2$), an alkali metal compound ($Na_2O+Li_2O+K_2O$), an alkaline earth metal oxide ($CaO+SrO+BaO+MgO$), and neodymium oxide ($Nd_2O_3$) were respectively 63.9%, 13.7%, 13.7%, and 8.7%. The glass was fused at 1200° C. and subsequently formed into a plate shape. Within the alkali metal oxide, $Na_2O$, $Li_2O$, and $K_2O$ had the same weight. Similarly, within the alkaline earth metal oxide, CaO, SrO, BaO, and MgO had the same weight. The resulting plate glass was then annealed for two hours at 1000° C. under a flow of nitrogen gas of 100 cc/minute. The filter characteristics in the wavelength range from 570 nm to 590 nm were sharp after this treatment.

A different method for manufacturing glass containing neodymium is the sol-gel method described below. 30 g of a neodymium oxide powder having a diameter of 7 μM is mixed into a solution containing 20 cc, 80 cc, and 80 cc respectively of tetraethyl orthosilicate $Si(OC_2H_5)_4$, water, and ethanol, thus yielding a mixed liquid. Several cubic centimeters of 0.01 mol/dm³ hydrochloric acid (or alternatively, nitric acid or acetic acid) is then added to the mixed liquid. This mixed liquid containing neodymium oxide powder is then turned into a gel. The resulting gel is injected into a plate mold and dried for two hours at 100° C. After drying, the product is baked for one hour at 800° C. to manufacture plate glass containing neodymium. A silicon alkoxide other than tetraethyl orthosilicate may also be used.

Furthermore, as shown in FIG. 22, the absorption wavelength band for the glass plate and the glass powder are roughly equal, whereas the absorption wavelength band for the Nd powder is shifted in the direction of longer wavelengths. Furthermore, the transmittance is approximately the same for the glass plate in the directions of both shorter and longer wavelengths of the absorption wavelength band, whereas the transmittance differs between the directions of shorter and longer wavelengths for the glass powder. Selectively exploiting these different characteristics allows for adjustment of the light emission characteristics of an LED lamp.

Modifications (1) While the embodiment discloses the structure of an LED module, the present invention is not limited to the above embodiment. For example, the following modifications are possible.

FIGS. 24A through 24D show modifications to the structure of the LED module.

In an LED module 5a, a translucent material 17 made of silicone resin or the like is sandwiched between a translucent material 13 and a plate-shaped filter 16. The refractive index of the translucent material 17 is equivalent to or higher than the refractive index of the translucent material 13 and lower than the refractive index of the filter 16. This structure enhances the filter effect described with reference to FIGS. 19, 20, and 21A through 21C.

An LED module 5b is an example in which an annular reflector element 18 having with a reflective inner face is disposed on a circuit board 11. A plate-shaped filter 16 is disposed on top of a reflector element 18. With this structure, light emitted from the LED light source towards the sides is reflected by the reflective face toward the front. Consequently, the intensity of light at the front of the LED lamp is increased.

An LED module 5c is an example of providing a translucent material 19 in a gap between an LED light source and a reflector element 18. This structure increases the flux ratio, while also increasing the intensity of light at the front of the LED lamp.

In an LED module 5d, a gap surrounded by a circuit board 11, a filter 16, and a reflector element 18 is packed with translucent material to form a translucent material 13.

Note that the filter may be formed by dispersing neodymium within the translucent material 13, which is formed from silicone resin or the like. In this case, the filter 16 is unnecessary.

When using the above sol-gel method to manufacture the translucent material 13 with phosphor dispersed therein, a desired effect can also be achieved by including neodymium. In this case, 30 g of a neodymium oxide powder having a diameter of 7 μm is mixed into a solution containing 20 cc, 80 cc, and 80 cc respectively of tetraethyl orthosilicate $Si(OC_2H_5)_4$, water, and ethanol, thus yielding a mixed liquid. A desired amount of phosphor is further mixed therein. Several cubic centimeters of 0.01 mol/dm³ hydrochloric acid (or alternatively, nitric acid or acetic acid) is then added to the mixed liquid. This mixed liquid containing neodymium oxide and phosphor is then turned into a gel. The resulting gel is injected into a plate mold and dried for two hours at 100° C. After drying, the product is baked for three hours at 200° C. to manufacture plate glass containing neodymium oxide and phosphor. In this case as well, the filter 16 is not necessary. Note that a silicon alkoxide other than tetraethyl orthosilicate may also be used.

(2) In the embodiment, the filter is a small piece of a plate, but the present invention is not limited in this way. For example, the following modifications are possible.

FIGS. 25A and 25B show modifications to the placement of the filter. In an LED lamp 1a, the globe 6a itself contains neodymium oxide, thus also functioning as a filter. An LED lamp 1b has a filter layer 7, which includes neodymium oxide, covering the inner surface of the globe 6. Alternatively, the filter layer 7 may cover the outer surface of the globe 6.

(3) In the embodiment, the LED lamp is light-bulb shaped, but the present invention is not limited in this way. For example, the following modifications are possible.

Figure 26:
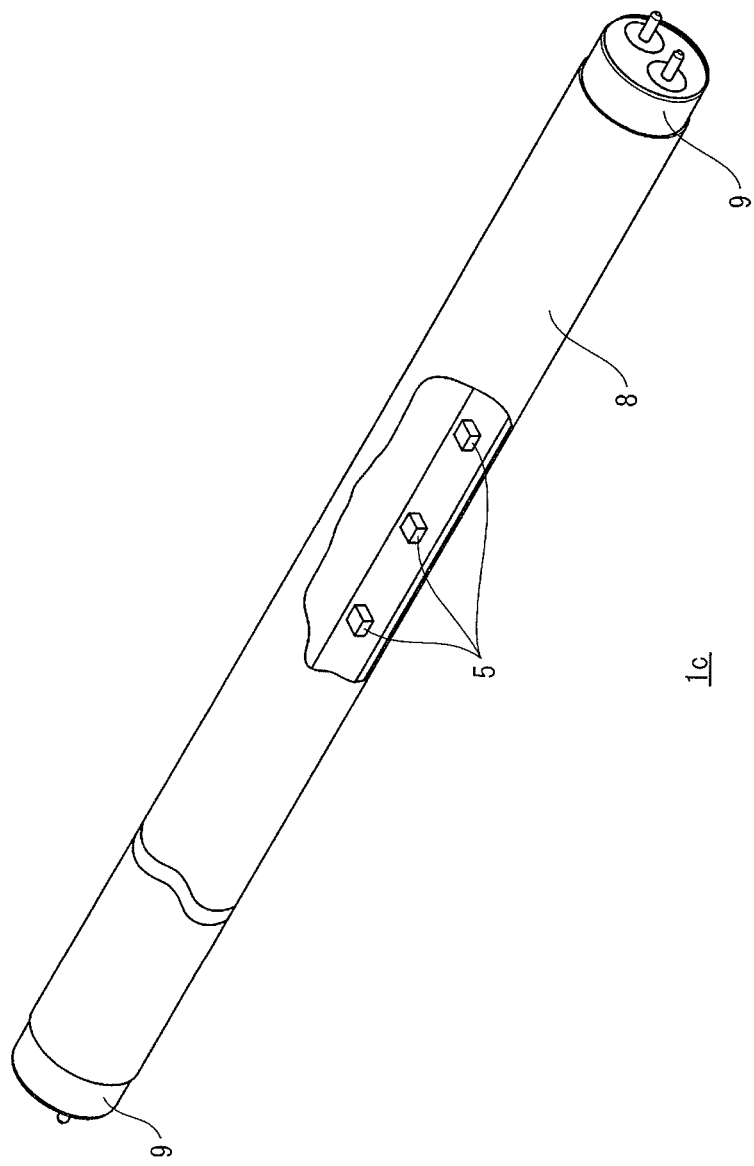
FIG. 26 shows a modification to the structure of the LED lamp.

FIG. 26 shows a modification to the structure of the LED lamp. An LED lamp 1c is a substitute for a straight tube fluorescent lamp. LED modules 5 are provided in a line inside a straight glass tube 8. At each end of the glass tube 8, a base 9 is provided to receive power supplied to the LED modules 5.

(4) In the embodiment, only an LED lamp is disclosed, but the LED lamp may be combined with a fixture and used as an LED illumination device.

Figure 27:
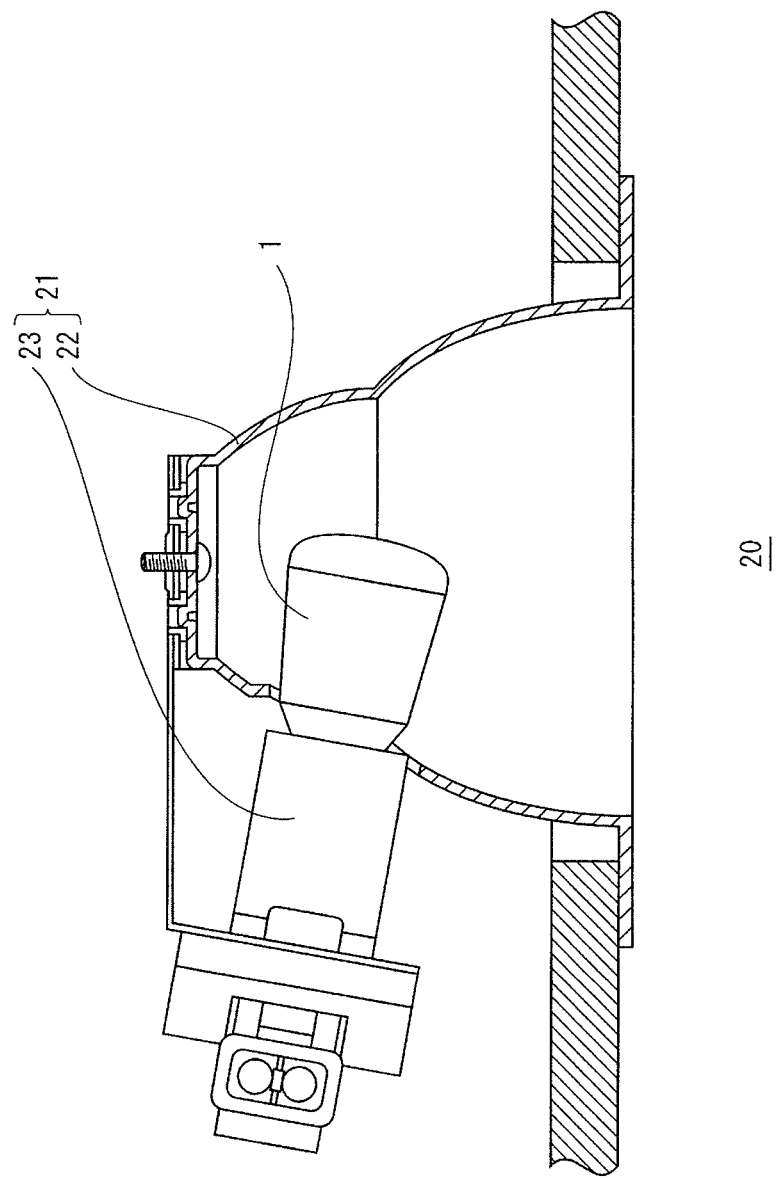
FIG. 27 shows the structure of an LED illumination device.

FIG. 27 shows the structure of an LED illumination device. An LED illumination device 20 includes an LED lamp 1 and a fixture 21. The fixture 21 includes a bowl-shaped reflector 22 and a socket 23. A base 3 of the LED lamp 1 is screwed into the socket 23.

(5) The embodiment describes an LED lamp used for general illumination in places such as restaurants and stores that sell merchandise. The present invention is not, however, limited in this way. The appearance of illuminated objects may be of great importance for medical equipment as well. As an example of such medical equipment, the following describes an endoscope system.

Figure 28:
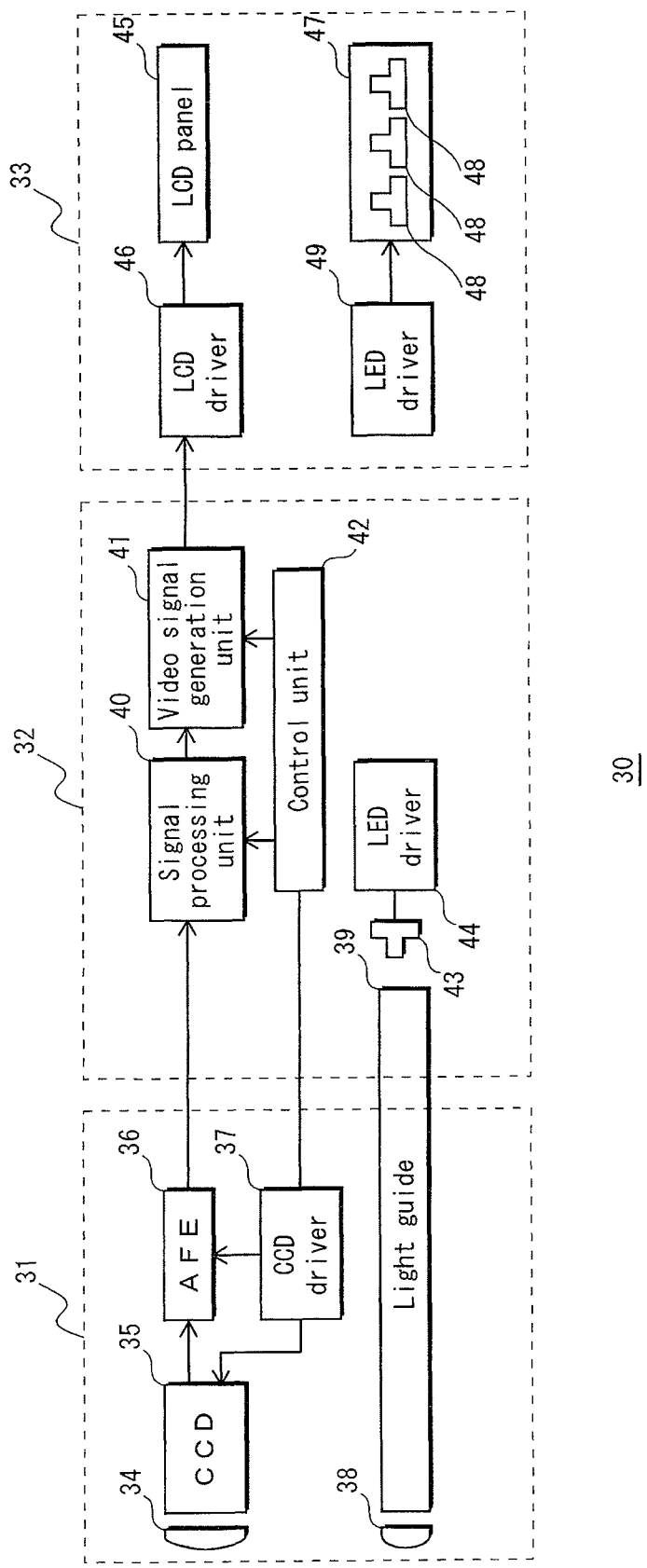
FIG. 28 shows the structure of an endoscope system.

FIG. 28 shows the structure of an endoscope system. An endoscope system 30 includes a scope unit 31, a processor unit 32 connected to the scope unit 31, and a display unit 33 connected to the processor unit 32.

The scope unit 31 is provided with a lens 34, a CCD (Charge Couple Device) image sensor 35 (hereinafter referred to as a CCD sensor), an AFE (Analog Front End) 36, a CCD driver 37, a lens 38, and a light guide 39. The AFE 36 includes a CDS (Correlated Double Sampling) circuit, an AGC (Auto Gain Control) circuit, and an ADC (Analog Digital Converter) circuit.

The processor unit 32 is provided with a signal processing unit 40, a video signal generation unit 41, a control unit 42, an LED module 43, and an LED driver 44. The LED module 43 emits light through the light guide 39 and the lens 38 in order to illuminate the area to be photographed by the CCD sensor 35.

The display unit 33 is provided with an LCD (Liquid Crystal Display) panel 45, and LCD driver 46, a backlight 47, and an LED driver 49. The backlight 47 includes LED modules 48. The display unit 33 displays the image photographed by the CCD sensor 35.

The doctor looks at the image displayed on the display unit 33 in order to diagnose the inside of the patient's body. Therefore, it is crucial for the colors in the image displayed on the display unit 33 to have a natural appearance. In particular, body tissue often appears red, making it crucial for not only middle colors but also strong red to have a natural appearance.

Figure 29A:
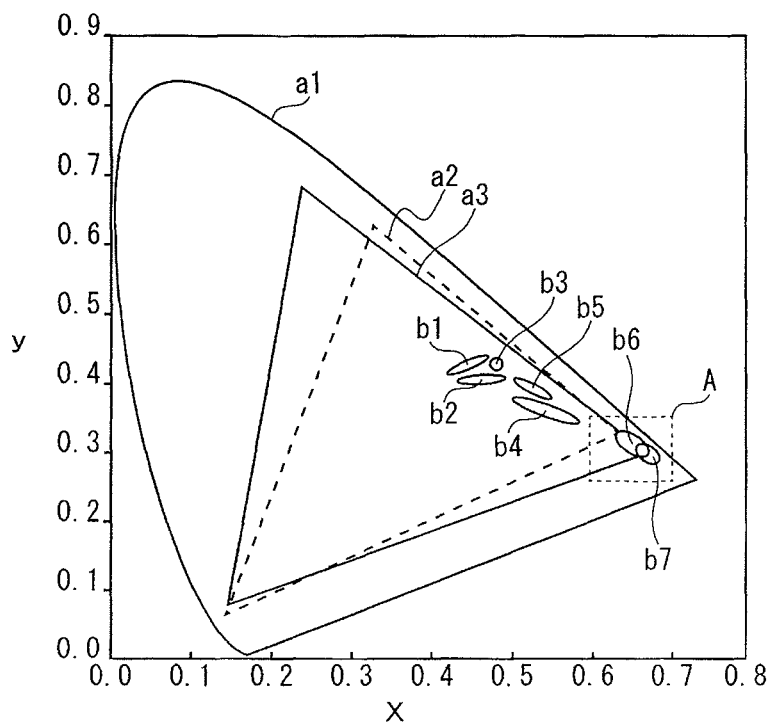
FIGS. 29A and 29B are xy chromaticity diagrams indicating a chromaticity range of colors reproducible by a display unit and chromaticity ranges of various body tissues, with FIG. 29A showing the entirety of the ranges, and FIG. 29B showing a magnified view of portion A.
Figure 29B:
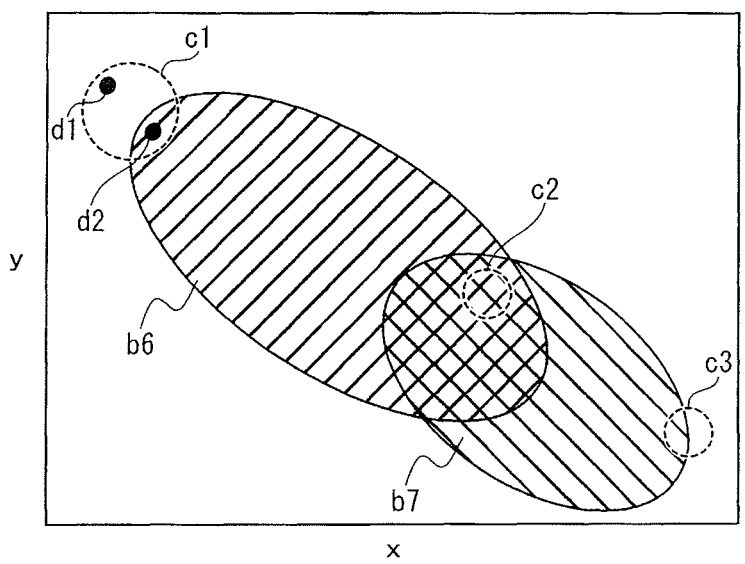

FIGS. 29A and 29B are xy chromaticity diagrams indicating a chromaticity range of colors reproducible by the display unit and chromaticity ranges of various body tissues. FIG. 29A shows the entirety of the ranges, whereas FIG. 29B is a magnified view of portion A.

The range a1 is the chromaticity range bounded by the spectral locus and the purple boundary.

The range a2 is an example of a chromaticity range of reproducible colors when conventional LED modules are used in the backlight of the display unit. A conventional LED module is a combination of a blue LED and a yellow phosphor (YAG).

The range a3 is an example of a chromaticity range of reproducible colors when the LED modules of the present invention are used in the backlight of the display unit. The LED module of the present invention includes a blue LED with a main emission peak in the wavelength range from 440 nm to 460 nm, a green/yellow phosphor with a main emission peak in the wavelength range from 500 nm to 595 nm, a red phosphor with a main emission peak in the wavelength range from 600 nm to 690 nm, and a filter that reduces the spectral radiation intensity of at least a portion of the wavelength range from 570 nm to 590 nm.

The ranges b1-b7 are the chromaticity ranges of various body tissues: b1 is for tendons, b2 for fascia, b3 for adipose tissue, b4 for muscle tissue, b5 for nerves, b6 for arterial blood, and b7 for venous blood.

The red chromaticity is indicated by c1 when using a conventional light source in the backlight of the display unit, by d1 when using LED modules with a combination of a blue LED and a yellow phosphor as the conventional light source, and by d2 when using a cold-cathode fluorescent lamp as the conventional light source.

The red chromaticity is indicated by c2 and by c3 when using the LED modules of the present invention in the backlight of the display unit, with c2 representing a main emission peak of 626 nm for the red phosphor, and c3 representing a main emission peak of 645 nm for the red phosphor.

As is clear, the chromaticity range of colors reproducible by the display unit with conventional LED modules includes the chromaticity ranges of tendons, fascia, adipose tissue, muscle tissue, and nerves, but not for arterial blood and venous blood. With such a display unit, arterial and venous blood appear colorless (grey) within the image, making these types of blood indistinguishable in terms of color. By contrast, the chromaticity range of colors reproducible by the display unit with LED modules of the present invention includes the chromaticity ranges of tendons, fascia, adipose tissue, muscle tissue, nerves, and arterial blood. Furthermore, depending on the emission peak of the red phosphor, either a portion (626 nm) or the entirety (645 nm) of the chromaticity range for venous blood is included. With this display unit, the color of arterial blood differs from that of venous blood in the image, thus making it possible to distinguish between arterial blood and venous blood based on color.

Note that in order to represent the color of body tissue naturally within the image, it is necessary not only to expand the chromaticity range of colors reproducible by the display unit, but also to increase the color rendering of the LED module that illuminates the body tissue. If body tissue is illuminated with an unnatural color, the color of the body tissue in the image will of course appear unnatural, even if the chromaticity range of colors reproducible by the display unit is expanded. Conversely, if the LED module illuminating the body tissue is equivalent to the LED module in a display unit with a wide chromaticity range of reproducible colors, the colors of body tissue in the image will have a natural appearance. Accordingly, adopting the LED module of the present invention as the LED module illuminating the body tissue achieves an endoscope system that can represent body tissue naturally. In this case, specifically setting the main emission peak of the red phosphor to be 626 nm or greater achieves an endoscope system that allows for a distinction between arterial blood and venous blood in images.

INDUSTRIAL APPLICABILITY

The present invention is useful for example in general illumination.

REFERENCE SIGNS LIST 1, 1a, 1b, 1c LED lamp
2 body
3 base
4 distal end of body
5, 5a, 5b, 5c, 5d LED module 6, 6a globe
7 filter layer
8 glass tube
9 base
11 circuit board
12 blue LED
13 translucent material
14 green/yellow phosphor
15 red phosphor
16 filter
17 translucent material
18 reflector element
19 translucent material
20 LED illumination device
21 fixture
22 reflector
23 socket

The invention claimed is:

1. An LED lamp comprising:
an LED light source including a blue LED with a main emission peak in a wavelength band of 440 nm to 460 nm, a green/yellow phosphor that is excited by light emitted by the blue LED, and a red phosphor that is excited by light emitted by at least one of the blue LED and the green/yellow phosphor; and
a filter that reduces spectral radiation intensity of at least a portion of a wavelength range from 570 nm to 590 nm among light emitted by the LED light source,
wherein a color of light transmitted through the filter is light bulb color as specified by Japanese Industrial Standard Z9112, and
wherein a maximum peak wavelength of mixed light before transmission through the filter, the mixed light being a mix of light emitted by the green/yellow phosphor and light emitted by the red phosphor, is in a wavelength range from 580 nm to 630 nm, and a full width at half maximum for the maximum peak wavelength is in a range of 120 nm to 175 nm.

2. An LED lamp comprising:
an LED light source including a blue LED with a main emission peak in a wavelength band of 440 nm to 460 nm, a green/yellow phosphor that is excited by light emitted by the blue LED, and a red phosphor that is excited by light emitted by at least one of the blue LED and the green/yellow phosphor; and
a filter that reduces spectral radiation intensity of at least a portion of a wavelength range from 570 nm to 590 nm among light emitted by the LED light source,
wherein a color of light transmitted through the filter is warm white as specified by Japanese Industrial Standard Z9112, and
wherein a maximum peak wavelength of mixed light before transmission through the filter, the mixed light being a mix of light emitted by the green/yellow phosphor and light emitted by the red phosphor, is in a wavelength range from 580 nm to 620 nm, and a full width at half maximum for the maximum peak wavelength is in a range of 120 nm to 175 nm.

3. An LED lamp comprising:
an LED light source including a blue LED with a main emission peak in a wavelength band of 440 nm to 460 nm, a green/yellow phosphor that is excited by light emitted by the blue LED, and a red phosphor that is excited by light emitted by at least one of the blue LED and the green/yellow phosphor; and
a filter that reduces spectral radiation intensity of at least a portion of a wavelength range from 570 nm to 590 nm among light emitted by the LED light source,
wherein a color of light transmitted through the filter is white as specified by Japanese Industrial Standard Z9112, and
wherein a maximum peak wavelength of mixed light before transmission through the filter, the mixed light being a mix of light emitted by the green/yellow phosphor and light emitted by the red phosphor, is in a wavelength range from 575 nm to 610 nm, and a full width at half maximum for the maximum peak wavelength is in a range of 120 nm to 180 nm.

4. An LED lamp comprising:
an LED light source including a blue LED with a main emission peak in a wavelength band of 440 nm to 460 nm, a green/yellow phosphor that is excited by light emitted by the blue LED, and a red phosphor that is excited by light emitted by at least one of the blue LED and the green/yellow phosphor; and
a filter that reduces spectral radiation intensity of at least a portion of a wavelength range from 570 nm to 590 nm among light emitted by the LED light source,
wherein a color of light transmitted through the filter is natural light as specified by Japanese Industrial Standard Z9112, and
wherein a maximum peak wavelength of mixed light before transmission through the filter, the mixed light being a mix of light emitted by the green/yellow phosphor and light emitted by the red phosphor, is in a wavelength range from 525 nm to 610 nm, and a full width at half maximum for the maximum peak wavelength is in a range of 125 nm to 180 nm.

5. An LED lamp comprising:
an LED light source including a blue LED with a main emission peak in a wavelength band of 440 nm to 460 nm, a green/yellow phosphor that is excited by light emitted by the blue LED, and a red phosphor that is excited by light emitted by at least one of the blue LED and the green/yellow phosphor; and
a filter that reduces spectral radiation intensity of at least a portion of a wavelength range from 570 nm to 590 nm among light emitted by the LED light source,
wherein a color of light transmitted through the filter is daylight as specified by Japanese Industrial Standard Z9112, and
wherein when a maximum peak wavelength of mixed light before transmission through the filter, the mixed light being a mix of light emitted by the green/yellow phosphor and light emitted by the red phosphor, is in a wavelength range from 520 nm to 530 nm, a full width at half maximum for the maximum peak wavelength is in a range of 135 nm to 170 nm, and when the maximum peak wavelength of light before transmission through the filter is in a wavelength range from 530 nm to 580 nm, the full width at half maximum for the maximum peak wavelength is in a range of 130 nm to 145 nm.

6. The LED lamp according to claim 1, wherein
the filter includes a neodymium compound.

7. The LED lamp of claim 6, wherein
the filter also serves as a globe covering the LED light source.

8. The LED lamp of claim 6, further comprising:
a globe covering the LED light source, wherein
the filter covers one of an inner surface and an outer surface of the globe.

9. The LED lamp of claim 6, wherein
the filter is shaped as a plate and is provided with a space between the LED light source and the filter.

10. The LED lamp of claim 6, wherein
the filter is shaped as a plate, and a translucent material is included between the LED light source and the filter, and
a refractive index of the translucent material is lower than a refractive index of the filter and is equal to or higher than a refractive index of a phosphor layer including the green/yellow phosphor and the red phosphor in the LED light source.

11. The LED lamp according to claim 6, wherein
the filter is made from a glass material.

12. The LED lamp according to claim 6, wherein
the filter is made from a resin material.

13. The LED lamp of claim 11, wherein
the filter that includes the neodymium compound has been manufactured by adding neodymium oxide to soda glass that includes silica, an alkali metal oxide, and an alkaline earth oxide.

14. The LED lamp of claim 11, wherein
the filter that includes the neodymium compound has been manufactured by adding neodymium oxide powder to a silicon alkoxide that includes tetraethyl orthosilicate.

15. The LED lamp of claim 6, further including:
translucent material having dispersed therein at least one of the green/yellow phosphor and the red phosphor, wherein
the filter is implemented by dispersing a neodymium compound in the translucent material.

16. The LED lamp of claim 15, wherein
a sol-gel method has been used to manufacture the translucent material, so that the translucent material has mixed therein the green/yellow phosphor, the red phosphor, and the neodymium compound.

17. The LED lamp of claim 1, wherein
a main emission peak of the green/yellow phosphor is in a wavelength band of 500 nm to 595 nm, and
a main emission peak of the red phosphor is in a wavelength band of 600 nm to 690 nm.

18. The LED lamp of claim 17, wherein
a main emission peak of the red phosphor is at least 626 nm.

19. An LED illumination device provided with the LED lamp of claim 1.

20. An LED module comprising:
a blue LED having a main emission peak in a wavelength band of 440 nm to 460 nm;
a green/yellow phosphor that is excited by light emitted by the blue LED;
a red phosphor that is excited by light emitted by at least one of the blue LED and the green/yellow phosphor; and
a filter that reduces spectral radiation intensity of at least a portion of a wavelength range from 570 nm to 590 nm among light emitted by the blue LED, the green/yellow phosphor, and the red phosphor, wherein
a color of light transmitted through the filter is light bulb color as specified by Japanese Industrial Standard Z9112, and
a maximum peak wavelength of mixed light before transmission through the filter, the mixed light being a mix of light emitted by the green/yellow phosphor and light emitted by the red phosphor, is in a wavelength range from 580 nm to 630 nm, and a full width at half maximum for the maximum peak wavelength is in a range of 120 nm to 175 nm.

21. An LED module comprising:
a blue LED having a main emission peak in a wavelength band of 440 nm to 460 nm;
a green/yellow phosphor that is excited by light emitted by the blue LED;
a red phosphor that is excited by light emitted by at least one of the blue LED and the green/yellow phosphor; and
a filter that reduces spectral radiation intensity of at least a portion of a wavelength range from 570 nm to 590 nm among light emitted by the blue LED, the green/yellow phosphor, and the red phosphor, wherein
a color of light transmitted through the filter is warm white as specified by Japanese Industrial Standard Z9112, and
a maximum peak wavelength of mixed light before transmission through the filter, the mixed light being a mix of light emitted by the green/yellow phosphor and light emitted by the red phosphor, is in a wavelength range from 580 nm to 620 nm, and a full width at half maximum for the maximum peak wavelength is in a range of 120 nm to 175 nm.

22. An LED module comprising:
a blue LED having a main emission peak in a wavelength band of 440 nm to 460 nm;
a green/yellow phosphor that is excited by light emitted by the blue LED;
a red phosphor that is excited by light emitted by at least one of the blue LED and the green/yellow phosphor; and
a filter that reduces spectral radiation intensity of at least a portion of a wavelength range from 570 nm to 590 nm among light emitted by the blue LED, the green/yellow phosphor, and the red phosphor, wherein
a color of light transmitted through the filter is white as specified by Japanese Industrial Standard Z9112, and
a maximum peak wavelength of mixed light before transmission through the filter, the mixed light being a mix of light emitted by the green/yellow phosphor and light emitted by the red phosphor, is in a wavelength range from 575 nm to 610 nm, and a full width at half maximum for the maximum peak wavelength is in a range of 120 nm to 180 nm.

23. An LED module comprising:
a blue LED having a main emission peak in a wavelength band of 440 nm to 460 nm;
a green/yellow phosphor that is excited by light emitted by the blue LED;
a red phosphor that is excited by light emitted by at least one of the blue LED and the green/yellow phosphor; and
a filter that reduces spectral radiation intensity of at least a portion of a wavelength range from 570 nm to 590 nm among light emitted by the blue LED, the green/yellow phosphor, and the red phosphor, wherein
a color of light transmitted through the filter is natural light as specified by Japanese Industrial Standard Z9112, and
a maximum peak wavelength of mixed light before transmission through the filter, the mixed light being a mix of light emitted by the green/yellow phosphor and light emitted by the red phosphor, is in a wavelength range from 525 nm to 610 nm, and a full width at half maximum for the maximum peak wavelength is in a range of 125 nm to 180 nm.

24. An LED module comprising:
a blue LED having a main emission peak in a wavelength band of 440 nm to 460 nm;
a green/yellow phosphor that is excited by light emitted by the blue LED;
a red phosphor that is excited by light emitted by at least one of the blue LED and the green/yellow phosphor; and a filter that reduces spectral radiation intensity of at least a portion of a wavelength range from 570 nm to 590 nm among light emitted by the blue LED, the green/yellow phosphor, and the red phosphor, wherein a color of light transmitted through the filter is daylight as specified by Japanese Industrial Standard Z9112, and when a maximum peak wavelength of mixed light before transmission through the filter, the mixed light being a mix of light emitted by the green/yellow phosphor and light emitted by the red phosphor, is in a wavelength range from 520 nm to 530 nm, a full width at half maximum for the maximum peak wavelength is in a range of 135 nm to 170 nm, and when the maximum peak wavelength of light before transmission through the filter is in a wavelength range from 530 nm to 580 nm, the full width at half maximum for the maximum peak wavelength is in a range of 130 nm to 145 nm.

\* \* \* \* \*